(12) United States Patent
Yamaguchi et al.

(10) Patent No.: US 8,470,695 B2
(45) Date of Patent: Jun. 25, 2013

(54) METHOD OF MANUFACTURING MICROMACHINE HAVING SPATIAL PORTION WITHIN

(75) Inventors: Mayumi Yamaguchi, Kanagawa (JP); Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 7 days.

(21) Appl. No.: 13/214,293

(22) Filed: Aug. 22, 2011

(65) Prior Publication Data

US 2011/0297940 A1 Dec. 8, 2011

Related U.S. Application Data

(62) Division of application No. 11/684,711, filed on Mar. 12, 2007, now Pat. No. 8,008,735.

(30) Foreign Application Priority Data

Mar. 20, 2006 (JP) ................................. 2006-076728

(51) Int. Cl.
*H01L 21/20* (2006.01)
*H01L 21/283* (2006.01)
*H01L 29/786* (2006.01)

(52) U.S. Cl.
USPC ........ 438/482; 257/57; 257/66; 257/E21.159; 257/E29.289; 257/E29.292; 438/585

(58) Field of Classification Search
USPC ......... 257/57, 66, E21.09, E21.159, E29.289, 257/E29.292; 438/482, 585
See application file for complete search history.

(56) References Cited

U.S. PATENT DOCUMENTS

| 5,550,090 A | 8/1996 | Ristic et al. |
| 5,808,331 A | 9/1998 | Zhang et al. |
| 5,882,960 A | 3/1999 | Zhang et al. |

(Continued)

FOREIGN PATENT DOCUMENTS

| CN | 1361551 A | 7/2002 |
| CN | 1420562 A | 5/2003 |

(Continued)

OTHER PUBLICATIONS

Chow. E et al., "High Voltage Thin Film Transistors Integrated With MEMS," The 13th International Conference on Solid-State Sensors, Actuators and Microsystems, Jun. 5, 2005, vol. 2, pp. 1318-1321, in English.

(Continued)

*Primary Examiner* — Lynne Gurley
*Assistant Examiner* — Vernon P Webb
(74) *Attorney, Agent, or Firm* — Fish & Richardson P.C.

(57) ABSTRACT

A semiconductor element of the electric circuit includes a semiconductor layer over a gate electrode. The semiconductor layer of the semiconductor element is formed of a layer including polycrystalline silicon which is obtained by crystallizing amorphous silicon by heat treatment or laser irradiation, over a substrate. The obtained layer including polycrystalline silicon is also used for a structure layer such as a movable electrode of a structure body. Therefore, the structure body and the electric circuit for controlling the structure body can be formed over one substrate. As a result, a micromachine can be miniaturized. Further, assembly and packaging are unnecessary, so that manufacturing cost can be reduced.

8 Claims, 25 Drawing Sheets

U.S. PATENT DOCUMENTS

| | | | |
|---|---|---|---|
| 5,895,933 | A | 4/1999 | Zhang et al. |
| 5,904,770 | A | 5/1999 | Ohtani et al. |
| 6,232,156 | B1 | 5/2001 | Ohtani et al. |
| 6,417,031 | B2 | 7/2002 | Ohtani et al. |
| 6,531,331 | B1 | 3/2003 | Bennett et al. |
| 6,730,549 | B1 | 5/2004 | Zhang et al. |
| 6,756,657 | B1 | 6/2004 | Zhang et al. |
| 6,860,939 | B2 | 3/2005 | Hartzell |
| 7,148,094 | B2 | 12/2006 | Zhang et al. |
| 2003/0075745 | A1 | 4/2003 | Maeda et al. |
| 2003/0075746 | A1 | 4/2003 | Maeda et al. |
| 2003/0196590 | A1 | 10/2003 | Hartzell |
| 2003/0196591 | A1 | 10/2003 | Hartzell |
| 2003/0196592 | A1 | 10/2003 | Hartzell |
| 2003/0196593 | A1 | 10/2003 | Hartzell |
| 2003/0197214 | A1 | 10/2003 | Hartzell |
| 2005/0130360 | A1 | 6/2005 | Zhan et al. |
| 2005/0153475 | A1 | 7/2005 | Hartzell |
| 2006/0267153 | A1 | 11/2006 | Yamaguchi et al. |
| 2006/0270238 | A1 | 11/2006 | Izumi et al. |
| 2006/0284183 | A1* | 12/2006 | Izumi et al. .............. 257/75 |

FOREIGN PATENT DOCUMENTS

| | | |
|---|---|---|
| DE | 19829609 A1 | 1/2000 |
| EP | 0 631 325 A2 | 12/1994 |
| EP | 0 762 510 A2 | 3/1997 |
| EP | 1 026 751 A2 | 8/2000 |
| EP | 1 026 752 A2 | 8/2000 |
| JP | 07-321339 A | 12/1995 |
| JP | 08-064828 A | 3/1996 |
| JP | 09-129896 A | 5/1997 |
| JP | 09-246569 A | 9/1997 |
| JP | 2000-208018 A | 7/2000 |
| JP | 2004-001201 A | 1/2004 |
| JP | 3590283 B2 | 11/2004 |
| JP | 2007-007845 A | 1/2007 |

OTHER PUBLICATIONS

European Search Report (Application No. 07005073.7), dated Mar. 15, 2012, in English.

Office Action, Chinese Application No. 200710088154.0; mailed Aug. 23, 2010, 21 pages with English translation.

Plummer et al., "Modern CMOS Technology," Silicon VLSI Technology: Fundamentals, Practice and Modeling, Apr. 30, 2003, pp. 49-51/84-92.

* cited by examiner

METHOD OF MANUFACTURING MICROMACHINE HAVING SPATIAL PORTION WITHIN

CROSS-REFERENCE TO RELATED APPLICATIONS

This application is a divisional of U.S. application Ser. No. 11/684,711, filed Mar. 12, 2007, now allowed, which claims the benefit of a foreign priority application filed in Japan as Serial No. 2006-076728 on Mar. 20, 2006, both of which are incorporated by reference.

BACKGROUND OF THE INVENTION

1. Field of the Invention

The present invention relates to a micromachine which includes a structure body and an electric circuit having a semiconductor element over one substrate, and a method for manufacturing the micromachine.

2. Description of the Related Art

A micromachine is also called MEMS (Micro Electro Mechanical Systems) and MST (Micro System Technology) and refers to a comprehensive system combining a micromechanical structure body and an electric circuit. The above structure body is different from a general semiconductor element in having a three-dimensional structure, a part of which is movable in many cases. The structure body can have various functions like a passive element such as a sensor, an actuator, an inductor, or a variable capacitor, a switch, or the like. The electric circuit is generally formed using a semiconductor element and can control the operation of the structure body, or receive and process a weak signal outputted from the structure body.

Further, micromachines can be classified into two groups according to their manufacturing methods. One is bulk micromachines in which structure bodies are manufactured using crystal anisotropy of a silicon substrate, and the other is surface micromachines in which three-dimensional structure bodies are manufactured over various substrates by stacking thin films (see Reference 1: Japanese Patent Publication No. 3590283). In particular, surface micromachines have been actively researched, especially in the United States, because a structure body and an electric circuit can be formed over one substrate.

SUMMARY OF THE INVENTION

A structure body included in a micromachine has a three-dimensional structure including a portion fixed to a substrate, a movable portion partially fixed to a substrate, and a spatial portion provided therebetween. A step of temporarily forming a layer for forming the shape of the spatial portion (referred to as a sacrifice layer), and a step of lastly removing the sacrifice layer which is referred to as sacrifice layer etching are required in order to provide the structure body with a spatial portion. Since these steps are different from those in manufacturing a general semiconductor element, a semiconductor element included in an electric circuit, and a structure are often manufactured over different substrates through different steps. A micromachine is often manufactured by manufacturing them separately and then integrating them with each other by attaching the substrates to each other or putting and connecting them in one package.

However, according to a method by which a semiconductor element and a structure body are manufactured separately as described above, it is very difficult to downsize a micromachine and reduce manufacturing cost. It is currently desired to form a structure body and an electric circuit over one substrate for downsizing and cost reduction. Therefore, it is an object of the present invention to provide a micromachine in which a structure body and an electric circuit are formed over one substrate. It is another object of the present invention to provide a method for manufacturing the micromachine.

In order to achieve the above objects, one feature of the micromachine of the present invention is to include a structure body which is formed using a layer including polycrystalline silicon. The polycrystalline silicon is formed by, for example, thermal crystallization or laser crystallization. The polycrystalline silicon can also be formed by thermal crystallization or laser crystallization using metal. Polycrystalline silicon as described above can be formed over a substrate having an insulating surface, for example, a glass substrate and has high strength in thin film form; therefore, it can be used for the structure body. Further, the use of the polycrystalline silicon for a semiconductor layer of a semiconductor element can improve the electrical property of the semiconductor element. A micromachine including a structure body and an electric circuit over one substrate can be manufactured by forming a structure body and a semiconductor element using polycrystalline silicon as described above.

A micromachine and a structure body included in a micromachine are described. The micromachine of the present invention includes a structure body having a three-dimensional structure with a selectively-formed spatial portion and an electric circuit for controlling the structure body and detecting the output from the structure body. The structure body includes two electrodes which face each other with the spatial portion interposed therebetween. One of them is a fixed electrode which is fixed to a substrate and is not movable (also referred to as a first conductive layer in this specification), and the other is a movable electrode which is partially fixed to a substrate and is movable (also referred to as a second conductive layer in this specification). The second conductive layer which is movable may be formed using a single layer, but a movable portion may also be formed by stacking an insulating layer, a semiconductor layer, and the like above and below the second conductive layer. In this specification, a movable layer formed using a single layer or a stacked layer of the second conductive layer or an insulating layer is referred to as a structure layer. The spatial portion included in the structure body is formed by initially forming a sacrifice layer to form the shape of the spatial portion and lastly removing the sacrifice layer. The removal of the sacrifice layer is performed by etching, and this step is referred to as sacrifice layer etching in this specification.

In the structure body, the structure layer can move in the spatial portion in many cases. The movement of the structure layer here includes up-and-down movement (along a direction perpendicular to a substrate), lateral movement (along a direction parallel to a substrate), and rotation on a certain axis with one or more points of the structure layer connected to and supported by the substrate.

One feature of the micromachine of the present invention is to include an electric circuit and a structure body electrically connected to the electric circuit, which are provided over an insulating surface. The structure body includes a semiconductor layer and a spatial portion. The spatial portion of the structure body is provided between the insulating surface and the semiconductor layer. The semiconductor layer of the structure body is a layer including polycrystalline silicon.

The layer including polycrystalline silicon can have a stacked structure of polycrystalline silicon and amorphous silicon. The layer including polycrystalline silicon can have a stacked structure of two or more layers of polycrystalline silicon, amorphous silicon, and a compound of silicon and metal. The layer including polycrystalline silicon can have a stacked structure of layers including polycrystalline silicon with different crystal growth directions. The layer including polycrystalline silicon can partially have a region with a different crystal structure.

The electric circuit of the micromachine of the present invention includes a semiconductor element. The semiconductor element includes a semiconductor layer over a gate electrode and can further include another gate electrode over the semiconductor layer.

The micromachine of the present invention can include an opposite substrate which faces the insulating surface. The opposite substrate is provided with a protective layer or a conductive layer. The protective layer is provided in a region where the structure body is not provided.

One feature of one of methods for manufacturing the micromachine of the present invention is as follows. A first conductive layer is formed over a substrate, and a first sacrifice layer is formed over the first conductive layer. A conductive film is formed and processed into a predetermined shape, thereby forming a gate electrode, and a second sacrifice layer over the first sacrifice layer. A first insulating layer is formed over the gate electrode. A film including silicon is formed and processed into a predetermined shape, thereby forming a semiconductor layer over the gate electrode with the first insulating layer interposed therebetween, and a structure layer over the second sacrifice layer, respectively. A part of the first sacrifice layer and the second sacrifice layer are removed.

One feature of one of methods for manufacturing the micromachine of the present invention is as follows. A first conductive layer is formed over a substrate, and a first sacrifice layer is formed over the first conductive layer. A conductive film is formed and processed into a predetermined shape, thereby forming a gate electrode, and a second sacrifice layer over the first sacrifice layer. A first insulating layer is formed over the gate electrode. A film including silicon is formed and processed into a predetermined shape, thereby forming a semiconductor layer over the gate electrode with the first insulating layer interposed therebetween, and a structure layer over the second sacrifice layer, respectively. A second insulating layer is formed over the semiconductor layer and the structure layer, and a second conductive layer is formed over the second insulating layer. A part of the second insulating layer is removed to expose a part of the first sacrifice layer and the second sacrifice layer, and a part of the first sacrifice layer, and the second sacrifice layer are removed.

One feature of one of methods for manufacturing the micromachine of the present invention is as follows. A first conductive layer is formed over a substrate, and a first sacrifice layer is formed over the first conductive layer. A conductive film is formed and processed into a predetermined shape, thereby forming a gate electrode, and a second sacrifice layer over the first sacrifice layer. A first insulating layer is formed over the gate electrode. A film including silicon is formed and processed into a predetermined shape, thereby forming a semiconductor layer over the gate electrode with the first insulating layer interposed therebetween, and a structure layer over the second sacrifice layer, respectively. A conductive film is formed and processed into a predetermined shape, thereby forming a second conductive layer over each of the semiconductor layer and the structure layer. A part of the first sacrifice layer and the second sacrifice layer are removed. In the above manufacturing method, a feature of the semiconductor layer is to be a stacked layer of an amorphous semiconductor or a semiconductor including microcrystal and a semiconductor to which an impurity is added.

One feature of one of methods for manufacturing the micromachine of the present invention is as follows. A first conductive layer and a first sacrifice layer are stacked over a substrate, and a conductive film is formed and processed into a predetermined shape, thereby forming a gate electrode, and a second sacrifice layer over the first sacrifice layer. A first insulating layer is formed over the gate electrode. A film including silicon is formed and processed into a predetermined shape, thereby forming a semiconductor layer over the gate electrode with the first insulating layer interposed therebetween, and a structure layer over the second sacrifice layer, respectively. A conductive film is formed and processed into a predetermined shape, thereby forming a second conductive layer over each of the semiconductor layer and the structure layer, and a second insulating layer is formed over the second conductive layer. A third conductive layer is formed over the second insulating layer, and a part of the second insulating layer is removed to expose a part of the first sacrifice layer and the second sacrifice layer, and a part of the first sacrifice layer, and the second sacrifice layer are removed. The semiconductor layer may be a stacked layer of an amorphous semiconductor or a semiconductor including microcrystal and a semiconductor to which an impurity is added.

One feature of one of methods for manufacturing the micromachine of the present invention is as follows. A first conductive layer and a first gate electrode are formed over a substrate. A first insulating layer is formed over the first gate electrode, and a semiconductor layer is formed over each of the first conductive layer, and the first gate electrode with the first insulating layer interposed therebetween. A second insulating layer is formed over the semiconductor layer over the first gate electrode, and a conductive film is formed and processed into a predetermined shape, thereby forming a second conductive layer over the semiconductor layer over the first conductive layer and a second gate electrode over the semiconductor layer over the first gate electrode, respectively. A part of the first conductive layer, or a part or all of the second conductive layer is removed.

One feature of one of methods for manufacturing the micromachine of the present invention is as follows. A first conductive layer and a first gate electrode are formed over a substrate. A first insulating layer is formed over the first gate electrode, and a semiconductor layer is formed over each of the first conductive layer, and the first gate electrode with the first insulating layer interposed therebetween. A second insulating layer is formed over the semiconductor layer over the first gate electrode. A conductive film is formed and processed into a predetermined shape, thereby forming a second conductive layer over the semiconductor layer over the first conductive layer and a second gate electrode over the semiconductor layer over the first gate electrode, respectively, and the semiconductor layer over the first conductive layer is removed.

One feature of one of methods for manufacturing the micromachine of the present invention is as follows. A first conductive layer and a first gate electrode are formed over a substrate, and a first insulating layer is formed over the first gate electrode. A semiconductor layer is formed over each of the first conductive layer, and the first gate electrode with the first insulating layer interposed therebetween. A second insulating layer is formed over the semiconductor layer over the first gate electrode. A conductive film is formed and processed into a predetermined shape, thereby forming a second conductive layer over the semiconductor layer over the first conductive layer and a second gate electrode over the semiconductor layer over the first gate electrode, respectively. A third insulating layer is formed over the second conductive layer and the second gate electrode, and a third conductive layer is formed over the third insulating layer. A part of the third insulating layer is removed to expose a part of the first conductive layer or the second conductive layer, and a part of the first conductive layer, or a part or all of the second conductive layer is removed.

One feature of one of methods for manufacturing the micromachine of the present invention is as follows. A first conductive layer and a first gate electrode are formed over a substrate, and a first insulating layer is formed over the first gate electrode. A semiconductor layer is formed over the first conductive layer, and the first gate electrode with the first insulating layer interposed therebetween. A second insulating layer is formed over the semiconductor layer over the first gate electrode. A conductive film is formed and processed into a predetermined shape, thereby forming a second conductive layer over the semiconductor layer over the first conductive layer and a second gate electrode over the semiconductor layer over the first gate electrode, respectively. A third insulating layer is formed over the second conductive layer and the second gate electrode, and a third conductive layer is formed over the third insulating layer. A part of the third insulating layer is removed to expose a part of the semiconductor layer over the first conductive layer, and the semiconductor layer over the first conductive layer is removed.

The present invention can provide a small-size micromachine because a structure body and an electric circuit including a semiconductor element are formed over one substrate. The manufacturing method of the present invention can downsize a micromachine as a whole because a structure body and an electric circuit including a semiconductor element can be simultaneously formed over one substrate. In addition, formation over one substrate can eliminate assembling and packaging steps, and can reduce manufacturing cost.

The present invention makes it possible to form a strong structure body and a semiconductor element with excellent element properties over one substrate by using polycrystalline silicon, which is crystallized over the substrate, for a structure layer of the structure body and a semiconductor layer of the semiconductor element. The polycrystalline silicon can be formed at a low temperature over a substrate having a low melting point such as a glass substrate by crystallizing silicon using a metal element such as nickel (Ni). In addition, the hardness, the spring constant, and the like of a structure layer can be adjusted and a structure layer having desired properties can be manufactured by stacking silicon having various properties such as amorphous silicon or polycrystalline silicon and a compound of silicon and metal.

DETAILED DESCRIPTION OF THE INVENTION

Figure 1A:
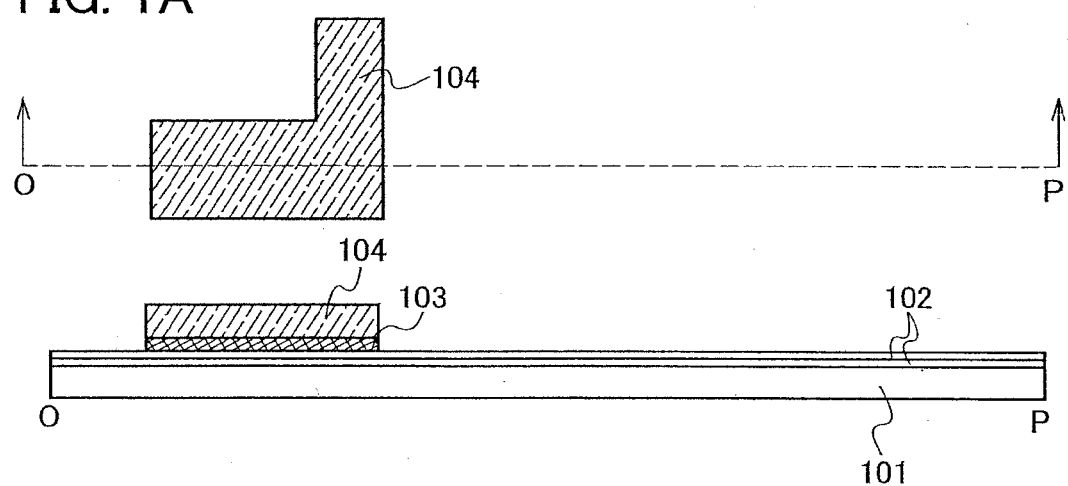
FIGS. 1A and 1B are diagrams illustrating a method for manufacturing a micromachine of the present invention.

Embodiment modes of the present invention are hereinafter explained with reference to the drawings. However, the present invention is not limited to the following description. This is because a person skilled in the art will easily understand that the mode and detail of the present invention can be variously modified without departing from the spirit and scope of the present invention. Therefore, the present invention is not interpreted as being limited to the following description of the embodiment modes. Note that the same reference numeral may be commonly used to denote the same portion among different diagrams in explaining the structure of the present invention with reference to drawings.

Embodiment Mode 1

This embodiment mode explains a method for manufacturing a structure body and an electric circuit electrically connected to the structure body, which are included in a micromachine, over one substrate with reference to FIGS. 1A to 5B. Some of the drawings each include a top view on an upper side and a cross-sectional view of the top view taken along a line O-P on a lower side. In this embodiment mode, a process of manufacturing a semiconductor element which constitutes a part of an electric circuit is typically described for convenience as a process of manufacturing the electric circuit. This applies to other embodiment modes.

<Substrate 101>

The structure body and the semiconductor element the micromachine of the present invention includes can be manufactured over an insulating substrate. The insulating substrate here can be, for example, a glass substrate, a quartz substrate, a plastic substrate, or the like. Further, a conductive substrate such as a metal substrate or a semiconductor substrate of silicon, germanium, a compound of silicon and germanium, or the like can also be used. In this case, the substrate can be used without any change, or may be used after an insulating layer is formed on its surface.

A highly-flexible and thin micromachine can be manufactured by forming the structure body and the semiconductor element over a thin and soft substrate like, for example, a plastic substrate. When the structure body and the semiconductor element are formed using a glass substrate, a thin micromachine can also be formed by polishing and thinning the substrate from the backside.

<Base Layer 102>

In this embodiment mode, a layer 102 serving as a base is formed over a substrate 101 having an insulating surface (see a lower diagram of FIG. 1A). The base layer 102 can be formed using an insulating layer such as a silicon oxide layer, a silicon nitride layer, or a silicon oxynitride layer. The base layer 102 may be formed using a single layer of the above-mentioned material or by stacking a plurality of the materials. This embodiment mode describes an example of stacking two layers as the base layer 102.

As a first layer of the base layer 102, a silicon oxynitride layer can be formed by a plasma CVD method using $SiH_4$, $NH_3$, $N_2O$, and $H_2$ as reactive gases with a thickness of 10 nm to 200 nm (preferably 50 nm to 100 nm). In this embodiment mode, a silicon oxynitride layer with a thickness of 50 nm is formed. Next, as a second layer of the base layer 102, a silicon oxynitride layer can be formed thereover by a plasma CVD method using $SiH_4$ and $N_2O$ as reactive gases with a thickness of 50 nm to 200 nm (preferably 100 nm to 150 nm). In this embodiment mode, a silicon oxynitride layer with a thickness of 100 nm is formed.

<First Conductive Layer 103>

Next, a conductive layer is formed over the base layer 102 and processed into a predetermined shape, thereby forming a first conductive layer 103 for driving the structure body. As the conductive layer for forming the first conductive layer 103, a film of an element or a compound of metal, silicon, or the like such as tantalum or tantalum nitride is formed by a sputtering method, a CVD method, or the like. Then, a resist mask is formed by a photolithography method, and the film is processed by etching. The etching performed here is desirably anisotropic dry etching capable of processing a layer perpendicularly to the substrate.

<First Sacrifice Layer 104>

Next, a layer for forming a first sacrifice layer 104 is formed over the first conductive layer 103 and processed into a predetermined shape, thereby forming the first sacrifice layer 104. As the layer for forming the first sacrifice layer 104, a film of an element or a compound of metal, silicon, or the like such as tungsten or silicon nitride is formed by a sputtering method, a CVD method, or the like. Then, similarly to the first conductive layer 103, a resist mask is formed by a photolithography method, and the layer is processed by etching.

Here, the first conductive layer 103 and the first sacrifice layer 104 can be processed at the same time. In this case, the layers for forming the first conductive layer 103 and the first sacrifice layer 104 are continuously formed, a resist mask is formed by a photolithography method, and the layers are processed at the same time by etching in a self-aligned manner. By processing two layers at the same time as described above, the number of reticles (also referred to as photomasks) to be used can be reduced, and the cost for manufacturing a micromachine can be reduced. This embodiment mode describes an example of processing the first conductive layer 103 and the first sacrifice layer 104 at the same time (see FIG. 1A).

Here, the thickness of the first sacrifice layer 104 is determined by considering various factors such as a material of the first sacrifice layer 104, a structure and an operating method of the structure body, and a method of sacrifice layer etching. For example, when the first sacrifice layer 104 is too thin, there is a problem in that an etchant is not dispersed and the sacrifice layer below a structure layer is not etched. Further, when the sacrifice layer is thin, a phenomenon occurs in which a lower surface of the structure layer attaches to a substrate surface after etching the sacrifice layer (this phenomenon is also referred to as budding or sticking). On the other hand, when the sacrifice layer is too thick, there is a problem in that an extremely high drive voltage is required to operate the structure body by electrostatic attraction or the structure body does not operate in some cases.

In view of the above factors, the first sacrifice layer 104 has a thickness of 0.5 μm to 4 μm, preferably 1 μm to 2.5 μm in a case where the structure body is operated by, for example, electrostatic attraction between the conductive layer and the structure layer formed over the substrate.

A material used for forming the first sacrifice layer 104 preferably satisfies the condition where there is an etchant that has properties of etching the first sacrifice layer 104 but hardly etching the first conductive layer 103 and other layers which are not to be removed.

<Gate Electrode 105 and Second Sacrifice Layer 106>

Next, a gate electrode 105 which constitutes a part of a semiconductor element is formed over the base layer 102, and a second sacrifice layer 106 for forming the structure body is formed over the first sacrifice layer 104. The gate electrode 105 and the second sacrifice layer 106 are formed using a layer of conductive metal or compound such as molybdenum or tungsten by a sputtering method, a CVD method, or the like. Then, the formed conductive layer is processed by a photolithography method and etching, similarly to the first sacrifice layer 104 (see FIG. 1B).

For example, even when the first sacrifice layer 104 has strong internal stress and has poor adhesion to (is easily peeled from) the base layer 102 and the first conductive layer 103, the sacrifice layer can be formed to be thick by repeatedly forming a film of a sacrifice layer material and etching the film. This embodiment mode describes an example of separately forming two sacrifice layers (the first sacrifice layer 104 and the second sacrifice layer 106) in order to form the sacrifice layer to be thick. Further, this embodiment mode describes an example of forming the second sacrifice layer 106 and the gate electrode 105 at the same time.

A material for forming the second sacrifice layer 106 and the gate electrode 105 is preferably the same as that of the first sacrifice layer 104 or a material that can be etched by the same method. For example, when the first sacrifice layer 104 and the second sacrifice layer 106 are formed of the same material, sacrifice layer etching can be performed at a time; thus, the number of steps can be reduced. However, the sacrifice layers can be formed using different materials depending on a condition such as adhesion to a layer formed above or below the sacrifice layer. In this case, sacrifice layer etching for forming the structure body may be separately performed twice. This embodiment mode describes an example of forming the first sacrifice layer 104, and the second sacrifice layer 106 and the gate electrode 105 using the same material.

The first conductive layer 103, and the first sacrifice layer 104, the gate electrode 105, and the second sacrifice layer 106 are processed by etching (particularly, anisotropic dry etching). An example of the anisotropic dry etching is an ICP (Inductively Coupled Plasma) etching method. At this time, processability can be improved by appropriately adjusting etching conditions (such as the amount of power applied to a coil electrode, the amount of power applied to an electrode on the substrate 101 side, and the temperature of the electrode on the substrate 101 side). Note that an etching gas appropriately used for processing the first sacrifice layer 104, the second sacrifice layer 106, and the gate electrode 105 can be: a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$.

Figure 2A:
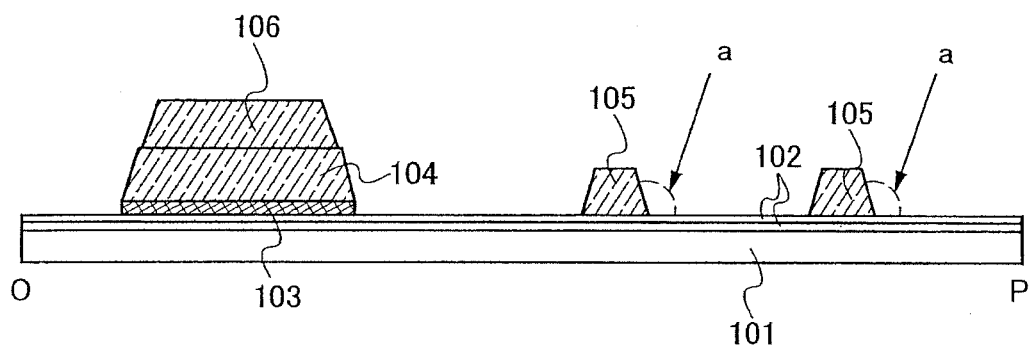
FIGS. 2A and 2B are diagrams illustrating a method for manufacturing a micromachine of the present invention.

By adjustment of the above etching conditions, the first sacrifice layer 104, the gate electrode 105, and the second sacrifice layer 106 can be processed into a predetermined shape such as a trapezoidal shape with a taper angle (see FIG. 2A). Here, the taper angle refers to an obtuse angle between the substrate and a layer side face (an angle indicated by "a" in FIG. 2A), and a cross section of a layer with a taper angle is trapezoidal. Alternatively, the layer for forming the first sacrifice layer 104 and the layer for forming the gate electrode 105 and the second sacrifice layer 106 can be formed using different materials in order to improve processability by etching as described above. When the first sacrifice layer 104, the gate electrode 105, and the second sacrifice layer 106 are each formed to have a shape with a taper angle as described above, a layer to be formed over a step can be uniformly formed.

Although the first sacrifice layer 104, the gate electrode 105, and the second sacrifice layer 106 are processed into a shape with a taper angle in FIG. 2A, not all layers need to be formed to have a taper angle. For example, only the first sacrifice layer 104 may be processed into a shape with a taper angle. Alternatively, it is possible that the first sacrifice layer 104 is not formed to have a taper angle and the gate electrode 105 and the second sacrifice layer 106 are formed to have a taper angle.

Figure 2B:
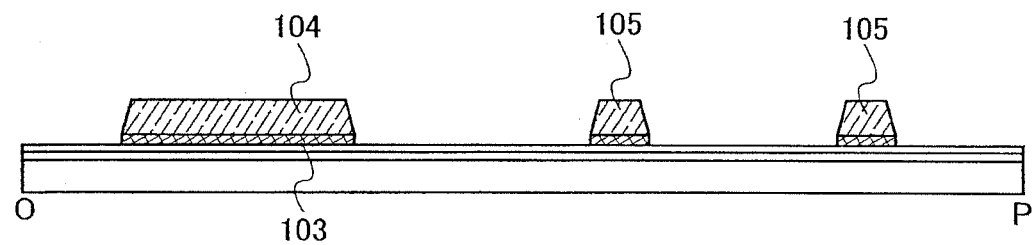

As shown in FIG. 2B, the sacrifice layer can be formed with a single layer. In this case, the gate electrode 105 can be formed at the same time as the first conductive layer 103 and the first sacrifice layer 104. By forming the sacrifice layer with a single layer, a single reticle (photomask) for the sacrifice layer becomes unnecessary, and the step of film formation and processing can be reduced.

<First Insulating Layer 107>

Figure 1B:
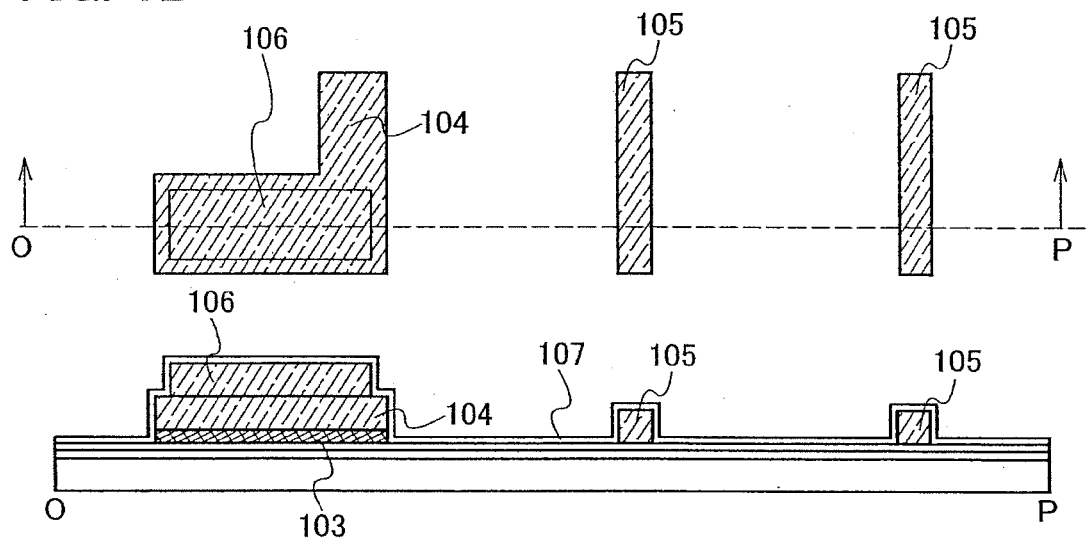

Next, a first insulating layer 107 is formed over the gate electrode 105 and the second sacrifice layer 106 as shown in FIG. 1B. The first insulating layer 107 functions as a gate insulating layer in the semiconductor element. Similarly to the above-described base layer 102, the first insulating layer 107 can be formed using a material including silicon such as silicon oxide or silicon nitride by a plasma CVD method, a sputtering method, or the like. For example, the first insulating layer 107 can be formed using a silicon oxynitride layer (composition ratio: Si=32%, O=59%, N=7%, H=2%) by a plasma CVD method with a thickness of 115 nm. However, the first insulating layer 107 is not limited to a silicon oxynitride layer and may be formed using a single layer or a stacked layer of other insulating layers including silicon.

The first insulating layer 107 can alternatively be formed using metal oxide with high permittivity such as hafnium (Hf) oxide or titanium (Ti) oxide. When the first insulating layer 107 is formed using such a high-permittivity material, the semiconductor element can be driven with low voltage and a micromachine which consumes low power can be manufactured.

Alternatively, the first insulating layer 107 can be formed by high-density plasma treatment. The high-density plasma treatment is plasma treatment with a plasma density of $1\times10^{11}$ $cm^{-3}$ or more, preferably $1\times10^{11}$ $cm^{-3}$ to $9\times10^{15}$ $cm^{-3}$ using a high frequency such as a microwave (for example, with a frequency of 2.45 GHz). When plasma is produced under such conditions, the electron temperature is as low as 0.2 eV to 2 eV. Thus, high-density plasma, a feature of which is low electron temperature, has low kinetic energy of active species; therefore, a layer can be formed with little plasma damage and few defects.

The substrate is placed in a film formation chamber capable of such plasma treatment, and film formation treatment is carried out with a distance between an electrode for generating plasma, a so-called antenna, and a target set in the range of 20 mm to 80 mm, preferably 20 mm to 60 mm. Such high-density plasma treatment can realize a low temperature process (substrate temperature: 400° C. or less). Accordingly, a glass or plastic substrate having low heat resistance can be used as the substrate 101.

The atmosphere for forming such an insulating layer may be a nitrogen atmosphere or an oxygen atmosphere. The nitrogen atmosphere is typically a mixed atmosphere of nitrogen and a rare gas, or a mixed atmosphere of nitrogen, hydrogen, and a rare gas. At least one of helium, neon, argon, krypton, and xenon can be used as the rare gas. The oxygen atmosphere is typically a mixed atmosphere of oxygen and a rare gas; a mixed atmosphere of oxygen, hydrogen, and a rare gas; or a mixed atmosphere of dinitrogen monoxide and a rare gas. At least one of helium, neon, argon, krypton, and xenon can be used as the rare gas.

The insulating layer formed by high-density plasma treatment is dense and causes little damage to other films. Further, the state of an interface between the insulating layer formed and a layer to be in contact therewith can be improved. For example, when the first insulating layer 107 is formed by oxidizing or nitriding a semiconductor layer through high-density plasma treatment, the state of an interface between the insulating layer and the semiconductor layer formed over the insulating layer can be improved. Accordingly, electrical properties of the semiconductor element can be improved. Further, by formation of the insulating layer over the structure layer as described above, damage to a layer for forming the structure body or the like can be reduced, and the strength of the structure layer can be maintained. In addition, high-density plasma treatment can also be used when forming not only the first insulating layer 107 but also the base layer 102 and another insulating layer.

<Semiconductor layer 109 and Structure Layer 108>

Figure 3A:
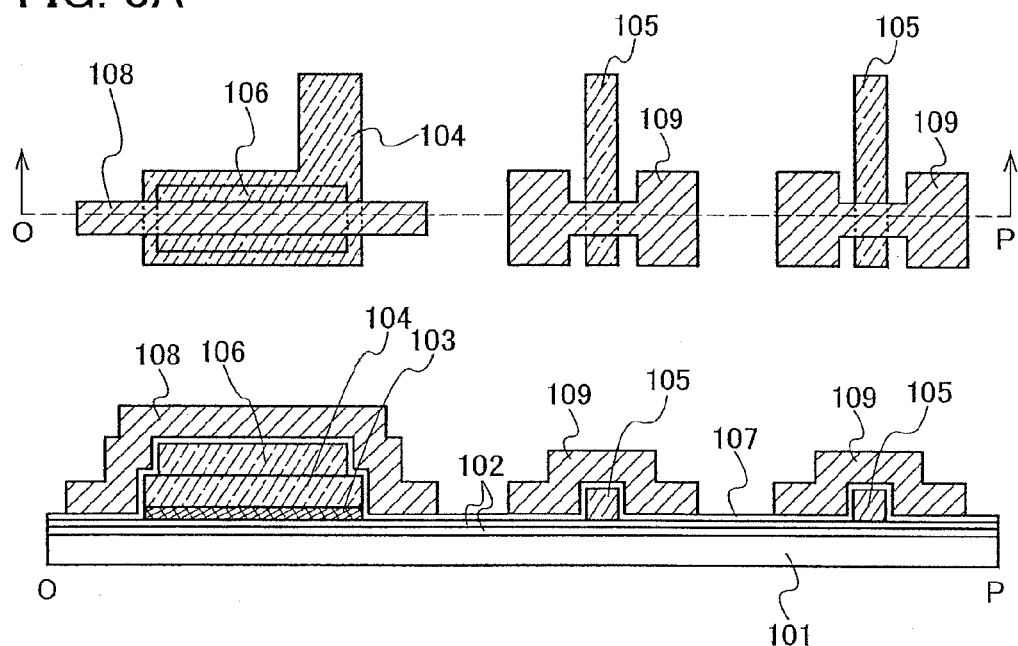
FIGS. 3A and 3B are diagrams illustrating a method for manufacturing a micromachine of the present invention.

Next, a semiconductor layer 109 which constitutes a part of the semiconductor element and a semiconductor layer to be a structure layer 108 which constitutes a part of the structure body are formed over the first insulating layer 107 and processed into a predetermined shape (see FIG. 3A). The semiconductor layer 109 and the structure layer 108 can be formed of a material including silicon. An example of the material including silicon is: silicon, silicon germanium including germanium of 0.01 atomic % to 4.5 atomic %, or the like. In the present invention, an amorphous semiconductor layer is formed and crystallized by heat treatment, thereby forming a crystalline semiconductor layer. The heat treatment may be performed by heating using a heating furnace, laser light irradiation, irradiation with light emitted from a lamp (also referred to as lamp annealing), or a combination thereof.

The material and the thickness of the structure layer 108 are determined by considering various factors such as thicknesses of the first sacrifice layer 104 and the second sacrifice layer 106, a material of the structure layer 108, a structure of the structure body, and a method of sacrifice layer etching. For example, the structure layer 108 warps when the structure layer 108 is formed using a material with a large distribution difference of internal stress. However, the structure body may be formed using this warpage of the structure layer 108. Since the structure layer 108 and the semiconductor layer 109 are formed at the same time in this embodiment mode, the structure layer 108 is formed using a crystalline semiconductor layer.

When the structure layer 108 is formed to be thick, the distribution of internal stress is generated, which may cause warpage or buckling. In contrast, when the structure layer 108 is thin, the structure body may be buckled due to the surface tension of a solution used for sacrifice layer etching. For example, in a case of forming the structure layer 108 using a semiconductor layer as in this embodiment mode, the thickness of the structure layer 108 is preferably 0.5 μm to 10 μm.

In a case of using laser irradiation in heat treatment for forming a crystalline semiconductor layer by crystallization of an amorphous semiconductor layer, a continuous wave laser beam (CW laser beam) or a pulsed laser beam can be used. As a laser beam, a laser beam emitted from one or more of the following lasers can be used: an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser. When a fundamental wave of such a laser or one of the second to fourth harmonics of the laser is used, crystals with a large grain size can be obtained. For example, the second harmonic (532 nm) or the third harmonic (355 nm) of an $Nd:YVO_4$ laser (fundamental wave: 1064 nm) can be used for irradiation. In this case, the laser beam requires a power density of approximately $0.01$ $MW/cm^2$ to $100$ $MW/cm^2$ (preferably $0.1$ $MW/cm^2$ to $10 MW/cm^2$). Then, irradiation is performed at a scan speed of approximately 10 cm/sec to 2000 cm/sec.

Note that a fundamental wave of a CW laser and a harmonic of a CW laser may be used for irradiation, or a fundamental wave of a CW laser and a harmonic of a pulsed laser may be used for irradiation. With the use of a plurality of laser beams, the energy can be compensated.

It is also possible to use a pulsed laser which emits a beam at a repetition rate that allows the laser beam of a next pulse to be applied after the semiconductor layer is melted by a previous laser beam and before it is solidified. By irradiation with a laser beam emitted at such a repetition rate, crystal grains which have grown continuously along the scan direction can be obtained. A specific repetition rate of the laser beam is 10 MHz or more; a frequency band used for the laser beam is significantly higher than a normally-used frequency band of several tens of hertz to several hundreds of hertz.

In a case of alternatively using a heating furnace for the heat treatment, the amorphous semiconductor layer is heated at 400° C. to 550° C. for 2 to 20 hours. At this time, it is preferable to set temperatures at multiple stages in the range of 400° C. to 550° C. so that the temperature becomes gradually higher. By a low-temperature heating step at approximately 400° C. at the initial stage, hydrogen or the like comes out of the amorphous semiconductor layer. Therefore, the surface roughness of the amorphous semiconductor layer due to crystallization can be reduced. Further, it is preferable to form a metal element such as Ni which promotes crystallization of silicon over the amorphous semiconductor layer because the heating temperature can be lowered. As the metal element, metal such as Fe, Ru, Rh, Pd, Os, Ir, Pt, Cu, Au, or the like can also be used. In addition to the heat treatment, irradiation with a laser beam using the aforementioned laser may be performed to form the crystalline semiconductor layer.

Since the metal element which promotes crystallization is a contaminant of a micromachine, the metal element may be removed after the crystallization. In this case, after crystallization by heat treatment or laser irradiation, a layer serving as a gettering sink is formed on a semiconductor layer and then heated, thereby moving the metal element to the gettering sink. A polycrystalline semiconductor layer or a semiconductor layer to which an impurity element is added can be used as the gettering sink. For example, a polycrystalline semiconductor layer to which an inert element such as argon is added can be formed over the semiconductor layer and can be used as a gettering sink. When an inert element is added, distortion can be generated in the polycrystalline semiconductor layer, and the metal element can be efficiently captured using the distortion. Alternatively, the metal element can be captured by forming a semiconductor layer to which an element such as phosphorus is added. Silicon can be used as a material of the semiconductor layer serving as a gettering sink.

Alternatively, each of the structure layer 108 and the semiconductor layer 109 may be a silicon layer having minute crystal grains in amorphous silicon. Crystal grains each having a radius of several tens of nanometers to several micrometers can be formed by using a CVD method and appropriately selecting silicon deposition conditions. Although the method in which high-density plasma treatment is used to form the first insulating layer 107 is explained, the semiconductor layer crystallized as described above may be subjected to high-density plasma treatment. The high-density plasma treatment can modify the surface of the semiconductor layer. Accordingly, an interface state can be improved, and electrical properties of the semiconductor element can be improved.

<Formation of Impurity Region>

Next, impurity elements are added to the semiconductor layer 109 which constitutes a part of the semiconductor element to form an n-type impurity region 110 and a p-type impurity region 111. Further, the structure layer 108 which constitutes a part of the structure body can be changed into an n-type impurity region or a p-type impurity region, or an impurity element can be prevented from being added thereto. Here, described is an example of changing the structure layer 108 into an n-type impurity region. The impurity region can be formed by selectively forming a resist mask by a photolithography method and adding an impurity element.

The impurity element can be added by an ion doping method or an ion implantation method. As an impurity element which imparts n-type conductivity, phosphorus (P) or arsenic (As) is typically used, and as an impurity element which imparts p-type conductivity, boron (B) can be used. It is desirable that an impurity element which imparts n-type conductivity and an impurity element which imparts p-type conductivity are added to the n-type impurity region and the p-type impurity region, respectively, in a concentration range of $1\times10^{20}/cm^3$ to $1\times10^{21}/cm^3$.

After the impurity regions are formed, heat treatment, infrared light irradiation, or laser light irradiation is carried out to activate the impurity elements. In particular, effective activation can be carried out particularly when the impurity elements are activated using an excimer laser from the front surface or from the backside in an atmosphere at room temperature to 300° C. Such activation can also repair plasma damage to the first insulating layer 107 and to an interface between the first insulating layer 107 and the semiconductor layer 109. Further, a second harmonic of a YAG laser may be used for the activation. The irradiation using the YAG laser is a preferable activation means because the YAG laser requires less maintenance.

Further, a passivation layer of an insulating layer such as a silicon oxynitride layer or a silicon oxide layer may be formed so as to cover the semiconductor layer 109 and the structure layer 108, so that hydrogenation may be performed. The hydrogenation is to terminate dangling bonds in the semiconductor layer 109, which are generated by the addition of impurity elements, by hydrogen contained in the passivation layer. At the same time, the aforementioned impurity region can be activated. For example, the semiconductor layer 109 can be hydrogenated by forming a silicon oxynitride layer over the semiconductor layer 109 and the structure layer 108 by a plasma CVD method with a thickness of 100 nm and then heating at 300° C. to 550° C. for 1 to 12 hours using a clean oven. Alternatively, the heating may be performed in a nitrogen atmosphere at 410° C. for one hour.

Figure 3B:
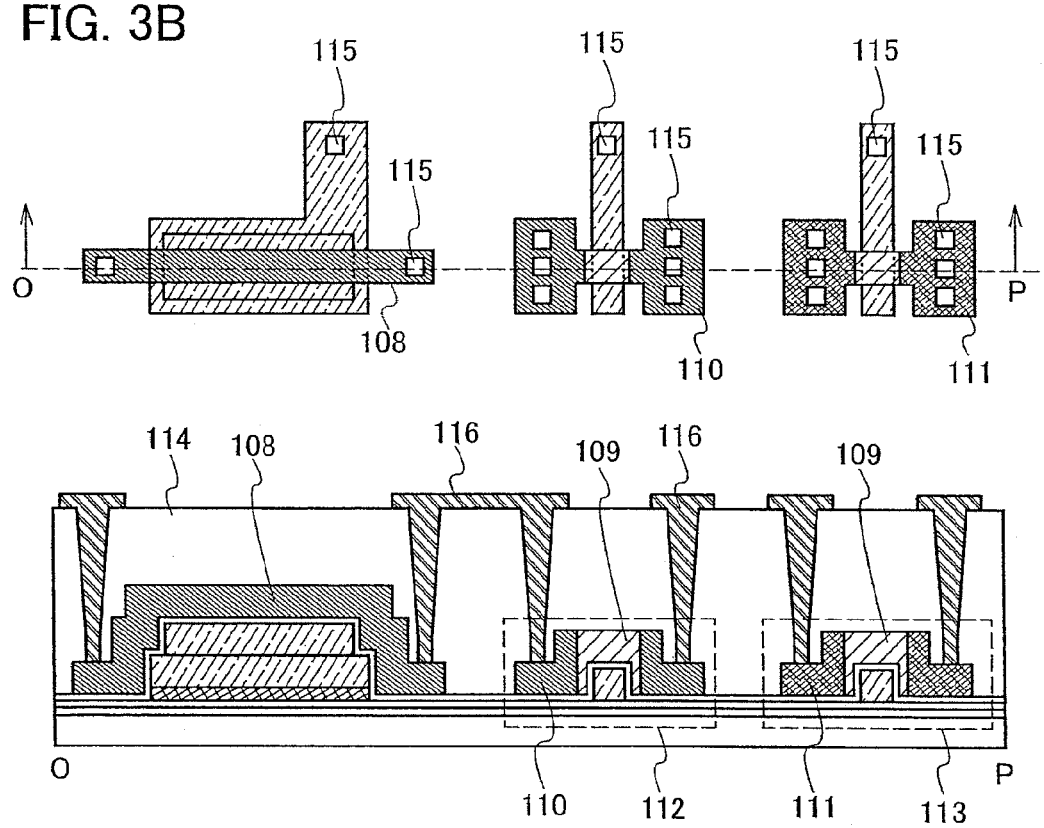

Through the above steps, an n-type semiconductor element 112 and a p-type semiconductor element 113 are formed (see FIG. 3B). Although the n-type semiconductor element 112 and the p-type semiconductor element 113 are formed in this embodiment mode, the electric circuit can also be formed using only either of them. When the electric circuit is formed using either the n-type semiconductor element 112 or the p-type semiconductor element 113 as described above, the number of reticles (photomasks) used for photolithography can be reduced and the number of manufacturing steps can be reduced. Here, transistors, specifically, bottom-gate thin film transistors are formed as the semiconductor elements 112 and 113.

<Second Insulating Layer 114>

Next, a second insulating layer 114 is formed over the n-type semiconductor element 112, the p-type semiconductor element 113, the structure layer 108, and the sacrifice layers 104 and 106 (see a lower diagram of FIG. 3B). The second insulating layer 114 can be formed of an inorganic compound, an organic compound, or the like having an insulating property. The second insulating layer 114 may be formed using a single layer of the above material having an insulating property or may be formed by stacking two or more layers. This second insulating layer 114 functions to insulate the first conductive layer 103 from a wiring to be formed thereover and to reduce parasitic capacitance. The second insulating layer 114 can also be used as a part of the structure body.

The inorganic material used to form the second insulating layer 114 can be silicon oxide or silicon nitride. The organic material can be polyimide, acrylic, polyamide, polyimide amide, benzocyclobutene, siloxane, or polysilazane. Note that a siloxane resin refers to a resin having a bond of silicon (Si) and oxygen (O). The skeletal structure of siloxane is formed from a bond of Si—O—Si. An organic group (for example, an alkyl group or aromatic hydrocarbon) containing at least hydrogen or a fluoro group is used as the substituent of the siloxane resin. Polysilazane is formed using a polymer material having a bond of silicon (Si) and nitrogen (N) as a starting material.

<First Contact Hole 115>

Next, the second insulating layer 114 is etched to form a first contact hole 115 (see FIG. 3B). The etching at this time can be carried out by either dry etching or wet etching. This embodiment mode describes an example of forming the first contact hole 115 by anisotropic dry etching.

<Second Conductive Layer 116>

Next, a second conductive layer 116 is formed over the second insulating layer 114 and the first contact hole 115. The second conductive layer 116 can be formed by formation of a layer of a conductive element such as aluminum (Al), titanium (Ti), molybdenum (Mo), tungsten (W), or silicon (Si), a compound thereof, or the like and processing of the layer by a similar method to those of the above-described other layers. The second conductive layer 116 serves as a source electrode and a drain electrode which are connected to the semiconductor elements 112 and 113, and electrically connects the structure body and the semiconductor element (see a lower diagram of FIG. 3B. The second conductive layer 116 is shown only in the cross-sectional view to make the diagram simpler).

Here, if the second conductive layer 116 has a pattern including a bend and a corner, the corner is preferably processed into a rounded shape. Accordingly, the generation of dust caused by flaking of the corner of the layer can be suppressed, and the substrate can be efficiently cleared of dust thereover. This is preferably applied when processing a layer formed of metal or a metal compound or a thick layer, such as the first sacrifice layer 104, the second sacrifice layer 106, or the gate electrode.

At the same time as the steps of forming the first contact hole 115 and the second conductive layer 116, some processing for forming the structure body may be carried out. For example, the second insulating layer 114 over the first sacrifice layer 104 and the second sacrifice layer 106 can be removed by etching at the same time as formation of the first contact hole 115 and the second conductive layer 116 can be formed over the structure layer 108, or a part of the structure layer 108 can be processed to be thin or removed by etching.

<Opening 117>

Figure 4A:
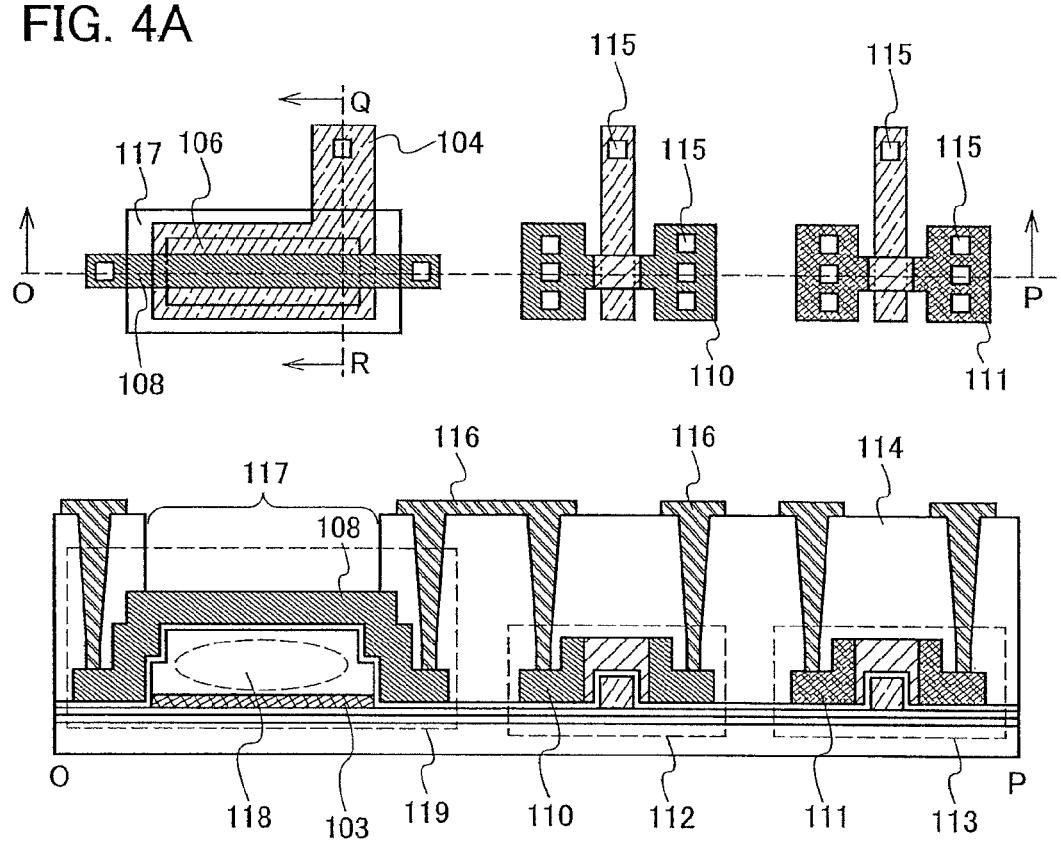
FIGS. 4A and 4B are diagrams illustrating a method for manufacturing a micromachine of the present invention.

Next, an opening 117 is formed in the second insulating layer 114 located over the first sacrifice layer 104, the second sacrifice layer 106, and the structure layer 108 for sacrifice layer etching (see FIG. 4A). The opening 117 can be formed by laser processing, dry etching, wet etching, or the like. This embodiment mode describes an example of forming the opening 117 using anisotropic dry etching similarly to the formation of the first contact hole 115.

Figure 4B:
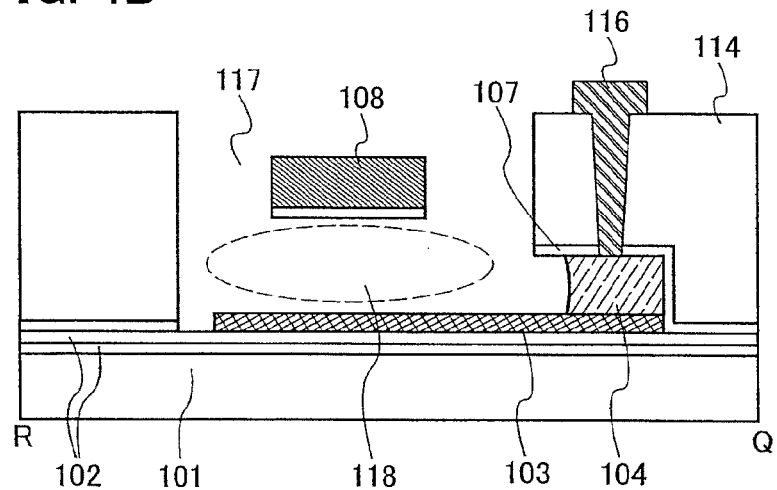

The opening 117 is formed to manufacture the structure body by removal of the sacrifice layers. Therefore, the opening 117 is formed by removing the second insulating layer 114 so as to expose a part of each of the first sacrifice layer 104 and the second sacrifice layer 106. When an edge portion of the first sacrifice layer 104 and an edge portion of the structure layer are electrically connected to the second conductive layer 116 through the first contact hole 115 as shown in FIGS. 4A and 4B, the opening 117 is preferably formed so that the connection portion and a periphery thereof remain.

<Third Insulating Layer (Protection of Integrated Circuit)>

A third insulating layer can be formed over the second insulating layer 114 and the second conductive layer 116 before forming the opening 117 in order to protect the semiconductor elements manufactured over the substrate. The third insulating layer can be formed of an inorganic compound, an organic compound, or the like having an insulating property (typically, a photosensitive resin of PI (polyimide), acrylic, or the like) similarly to the second insulating layer 114. The opening 117 can be formed after the third insulating layer is formed. This embodiment mode describes an example of not forming the third insulating layer.

<Sacrifice Layer Etching>

Next, the first sacrifice layer 104 and the second sacrifice layer 106 are removed by etching through the opening 117 (see a lower diagram of FIG. 4A). FIG. 4B shows a cross section of FIG. 4A after the sacrifice layer etching taken along a line Q-R in FIG. 4A. By removal of the first sacrifice layer 104 and the second sacrifice layer 106 through the opening 117 as described above, a movable structure layer 108, and a spatial portion 118 between the substrate and the structure layer are formed; thus, a structure body 119 can be manufactured. The sacrifice layer etching is performed by wet etching or dry etching using a suitable etchant depending on the kind of the sacrifice layer and the structure layer.

When the first sacrifice layer 104 and the second sacrifice layer 106 are formed of for example, tungsten (W), the sacrifice layer etching can be performed by wet etching using an ammonia hydrogen peroxide mixture as an etchant. Here, the ammonia hydrogen peroxide mixture is a solution which is obtained by mixing a 28% ammonia solution and a 31% hydrogen peroxide solution at a ratio of 1:2. When the first sacrifice layer 104 and the second sacrifice layer 106 are formed of a material including silicon dioxide, hydrofluoric acid or buffered hydrofluoric which is obtained by mixing a hydrofluoric acid 49% aqueous solution with ammonium fluoride at a ratio of 1:7. Although not described in this embodiment mode, when the first sacrifice layer 104 and the second sacrifice layer 106 are formed of a material including silicon, phosphoric acid; hydroxide of alkali metal such as KOH, NaOH, or CsOH; $NH_4OH$; hydrazine; EPD (mixture of ethylenediamine, pyrocatechol, and water); a tetramethylammonium hydroxide (TMAH) solution; an isopropyl alcohol (WA) solution; or the like can be used.

The above-described step of sacrifice layer etching is necessary to manufacture the structure body included in a micromachine. Thus, an appropriate combination of materials of the first sacrifice layer 104, the second sacrifice layer 106, and the structure layer 108 (further, various layers therearound), and an etchant for removing the sacrifice layers needs to be selected. When specific materials are selected for the sacrifice layer and the etchant, the structure layer is formed using a material, an etching rate of which is lower than that of the sacrifice layer.

In drying after wet etching, rinse is desirably carried out using an organic solvent with low viscosity (such as isopropyl alcohol or cyclohexane) or drying is desirably carried out at low temperature and low pressure, in order to prevent buckling that is the attachment of a lower surface of the structure layer 108 to the substrate surface due to capillarity. Further, surface treatment which makes the surface of the structure body hydrophobic can alternatively be carried out in order to prevent buckling due to capillarity at the time of drying.

The sacrifice layer etching can be carried out by dry etching with the use of an etching gas such as $F_2$ or $XeF_2$ under a condition of high pressure such as atmospheric pressure. In some cases, the lower surface of the structure layer may be attached to the substrate surface during the operation of the structure body. In order to prevent this phenomenon, plasma treatment can also be carried out to the surface of the structure body after the sacrifice layer etching.

This embodiment mode describes the structure body 119 having a structure in which the first sacrifice layer 104 is formed using a conductive material, the first conductive layer 103 and the first sacrifice layer 104 are processed in a self-aligned manner, and the first conductive layer 103 is electrically connected to the second conductive layer 116 with the first sacrifice layer 104 interposed therebetween (see FIG. 4B). Therefore, a part of the first sacrifice layer 104 remains without being etched away as shown in FIG. 4B. The part of the first sacrifice layer 104 can be left unetched by controlling the etching rate and the size of the opening 117.

Another Structural Example of Structure Body

In a case where the opening 117 is formed in only the second insulating layer 114 which is formed over the first sacrifice layer 104 and the second sacrifice layer 106 and the second insulating layer 114 formed over the structure layer 108 is not removed, the structure body can be formed to have a structure layer which is formed by stacking the structure layer 108 made of a semiconductor layer and the second insulating layer 114. Alternatively, the opening 117 can be formed after the first contact hole 115 is formed also in the second insulating layer 114 over the structure layer 108 when forming the first contact hole 115 as described above, the second conductive layer 116 is formed over the structure layer 108. By formation of the opening 117 so as to leave the second insulating layer 114 which is formed over the structure layer 108, a structure layer in which the structure layer 108 made of a semiconductor layer, the second conductive layer 116, and the second insulating layer 114 are stacked can be formed. On the other hand, by formation of the opening 117 so as to remove the second insulating layer 114 which is formed over the structure layer 108, a structure layer in which the structure layer 108 made of a semiconductor layer and the second conductive layer 116 are stacked can be formed.

<Opposite Substrate>

In order to seal the micromachine manufactured as described above or form a multilayer wiring, an opposite substrate can be attached. Here, the opposite substrate refers to a substrate which is attached so as to face the substrate 101 provided with the structure body 119 and the semiconductor elements 112 and 113. The opposite substrate can be an insulating substrate such as a glass substrate, a quartz substrate, or a plastic substrate similarly to the substrate 101.

Sealing with the opposite substrate can protect the micromachine from contamination and impact and maintain internal pressure and gas constant so as to make the micromachine operate. Further, in a case where the micromachine includes a plurality of electric circuits and structure bodies, and only the second conductive layer 116 is insufficient for wiring connection or the micromachine is desired to be miniaturized by multilayer interconnection, the opposite substrate can be provided with a third conductive layer and attached to the substrate.

Figure 5A:
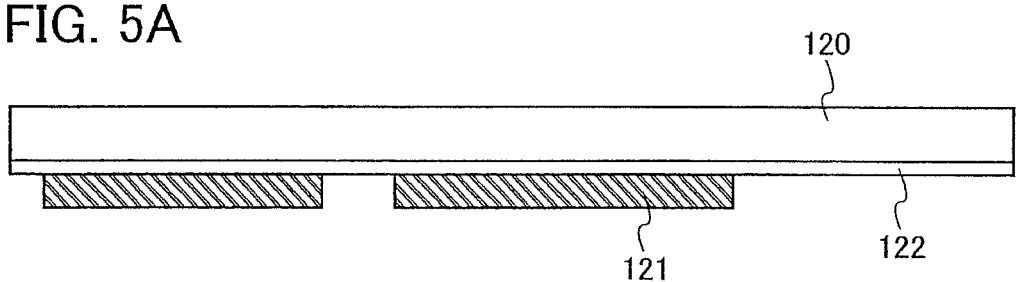
FIGS. 5A and 5B are diagrams illustrating a method for manufacturing a micromachine of the present invention.

For example, an opposite substrate 120 is provided with a third conductive layer 121 as shown in FIG. 5A. The third conductive layer 121 can be formed by forming a film of a conductive metal element or a compound thereof and processing the film similarly to the second conductive layer 116 or the like. In addition, the opposite substrate 120 may be provided with a base layer 122 when the opposite substrate 120 is provided with the third conductive layer 121. This base layer 122 can be formed using a similar material and a similar method to those of the base layer 102 which is formed over the substrate 101.

Figure 5B:
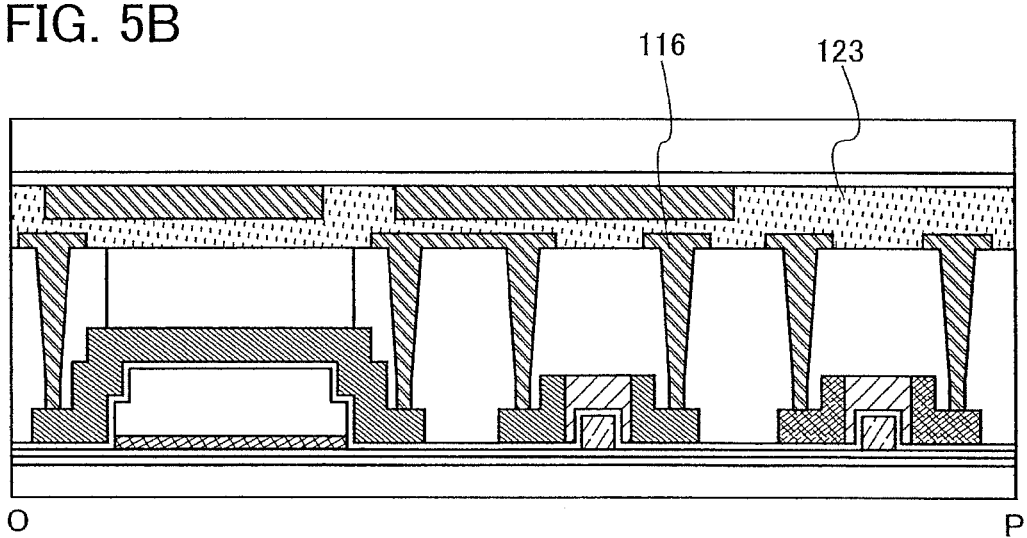

Then, the substrate 101 provided with the structure body and the semiconductor elements is attached to the opposite substrate 120 provided with the third conductive layer 121 (see FIG. 5B). In order to electrically connect the second conductive layer 116 to the third conductive layer 121, the substrate 101 can be attached to the opposite substrate 120 by using an anisotropic conductive material 123 which has conductivity only in the attachment direction (the direction perpendicular to the substrate).

The anisotropic conductive material 123 can be an anisotropic conductive paste (ACP) that is cured by heat or an anisotropic conductive film (ACF) that is cured by heat, either of which has conductivity only in a specific direction (here, the direction perpendicular to the substrate). The anisotropic conductive paste is called a binder layer and has a structure in which particles each having a conductive surface (hereinafter referred to as conductive particles) are dispersed in a layer which includes an adhesive as its main component. The anisotropic conductive film has a structure in which particles each having a conductive surface (hereinafter referred to as conductive particles) are dispersed in a thermosetting or thermoplastic resin film. Note that the particle having a conductive surface used here is a spherical resin plated with nickel (Ni), gold (Au), or the like. Insulating particles of silica or the like may be mixed in order to prevent an electrical short circuit between the conductive particles in an unnecessary portion. When the opposite substrate is provided with only an insulating layer, the substrate can be attached to the opposite substrate using a nonconductive adhesive.

When the micromachine performs wireless communication, the micromachine can be provided with an antenna using the opposite substrate 120. Specifically, the antenna is formed by forming and processing a conductive layer over the opposite substrate 120. In this case, the opposite substrate 120 may be provided with the base layer 122. The micromachine can be manufactured by attaching the substrate 101 to the opposite substrate 120 so as to electrically connect the second conductive layer 116 to the antenna similarly to the opposite substrate 120 provided with the third conductive layer 121.

Through the above steps, the micromachine which includes the structure body and the semiconductor element over one substrate can be manufactured. The structure body thus manufactured can function as, for example, an actuator that operates by electrostatic attraction by voltage application between the first conductive layer 103 and the structure layer 108. Alternatively, the structure body can be used as a sensor by detection of a change in height of the spatial portion 118 due to application of external force such as pressure to the structure layer 108.

As described above, the micromachine of the present invention does not require assembly and packaging steps because the structure body and the semiconductor element are manufactured over one substrate. Further, the micromachine can be miniaturized by manufacturing of them over one substrate and by formation and connection of a conductive layer with the use of an opposite substrate.

Embodiment Mode 2

This embodiment mode describes an example of manufacturing a micromachine which includes a structure body and a semiconductor element over one substrate by using a method different from that in the above embodiment mode. A micromachine and its manufacturing method of this embodiment mode are described with reference to FIGS. 6A to 9D. Some of the drawings each include a diagram showing a top view of a substrate on an upper side and a cross-sectional view of a top view along a line O-P on a lower side.

<Substrate 201, Base Layer 202, First Conductive Layer 203, Sacrifice Layers 204 and 206, Gate Electrode 205, and First Insulating Layer 207>

The micromachine of this embodiment mode can be manufactured over an insulating substrate similarly to Embodiment Mode 1. Similarly to the base layer 102, the first conductive layer 103, the first sacrifice layer 104, the gate electrode 105, the second insulating layer 114, and the first insulating layer 107 of Embodiment Mode 1, a base layer 202, a first conductive layer 203, a first sacrifice layer 204, a gate electrode 205, a second sacrifice layer 206, and a first insulating layer 207 are formed over a substrate 201. The first insulating layer 207 functions as a gate insulating layer in a semiconductor element (see FIG. 6A).

<Semiconductor Layer (Semiconductor Layer 209, First Structure Layer 208)>

Next, a semiconductor layer is formed over the first insulating layer 207 and processed into an arbitrary shape, thereby forming a first structure layer 208 which constitutes a part of a structure body and a semiconductor layer 209 which constitutes a part of a semiconductor element. The semiconductor layer can be formed using a material including silicon as in the above embodiment mode. This embodiment mode describes an example of forming the semiconductor layer using an amorphous semiconductor or an amorphous semiconductor including minute crystal grains, unlike in Embodiment Mode 1. First, a first semiconductor layer 210 which includes an amorphous semiconductor or an amorphous semiconductor including minute crystal grains is formed over the first insulating layer 207. These semiconductors can be deposited by a CVD method, and crystal grains each having a radius of several tens of nanometers to several micrometers can be formed by appropriately selecting a silicon deposition condition.

Next, a second semiconductor layer 211 having an amorphous structure to which an impurity imparting n-type conductivity or an impurity imparting p-type conductivity is added is formed over the semiconductor layer formed in the above step. As the impurity imparting n-type conductivity, phosphorus (P) or arsenic (As) can be typically used, and as the impurity imparting p-type conductivity, boron (B) can be used. It is desirable that an impurity element is added to the semiconductor including the impurity within a concentration range of $1\times10^{20}/cm^3$ to $1\times10^{21}/cm^3$. This embodiment mode describes an example of forming an amorphous semiconductor layer to which the impurity imparting n-type conductivity is added as the second semiconductor layer 211.

Figure 6A:
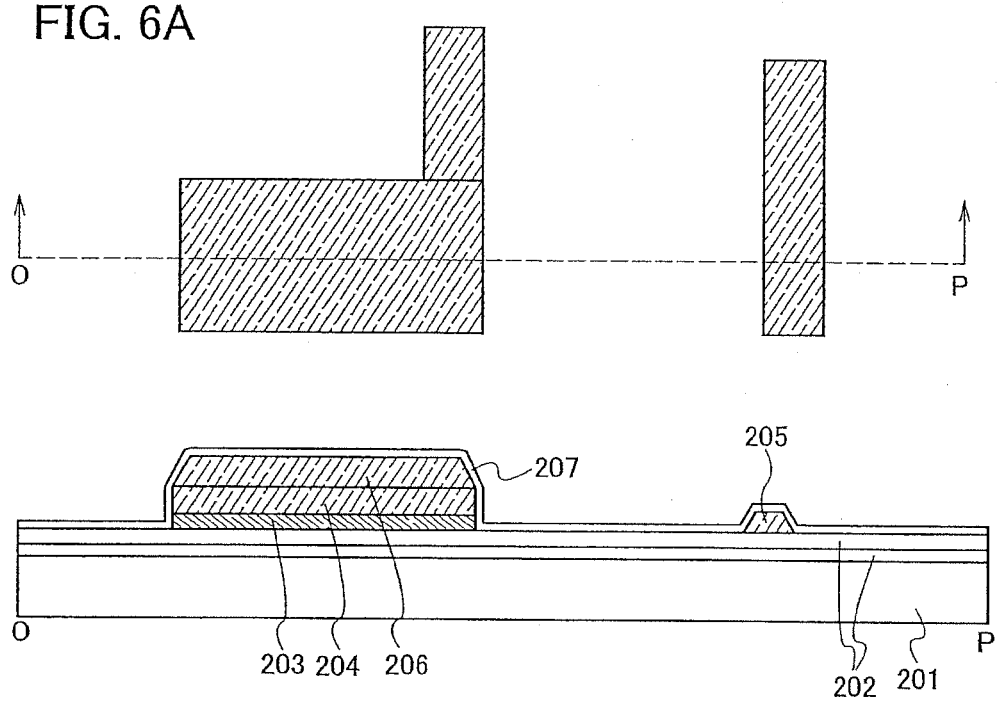
FIGS. 6A and 6B are diagrams illustrating a method for manufacturing a micromachine of the present invention.
Figure 6B:
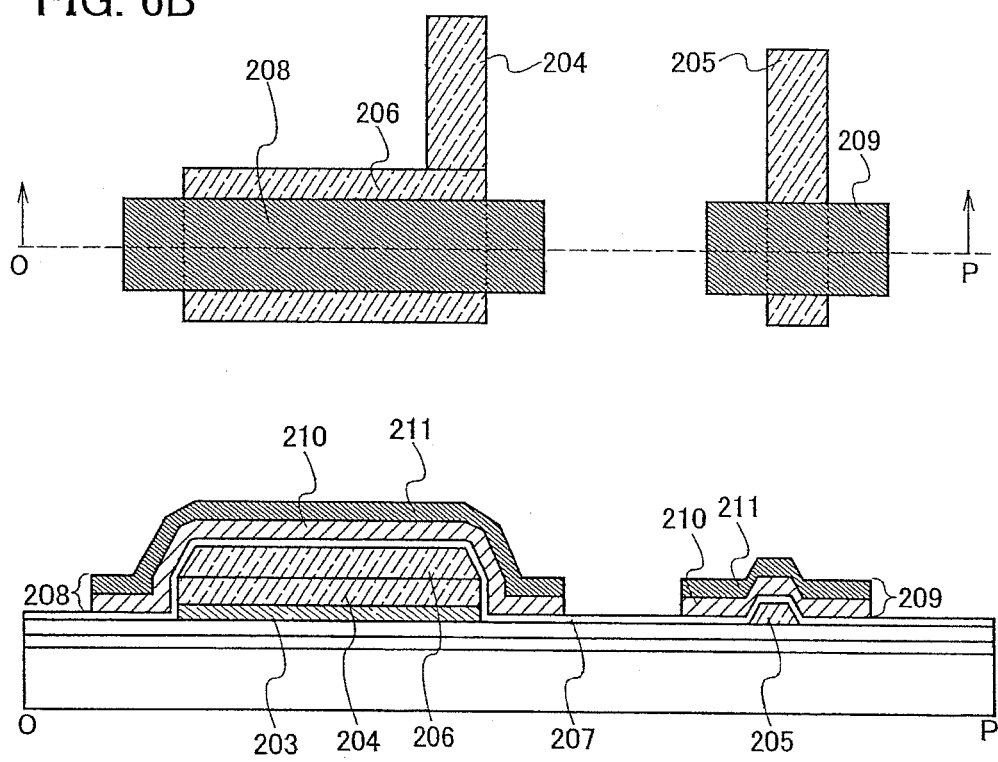

Then, the first semiconductor layer 210 and the second semiconductor layer 211 formed in the above step are processed into a predetermined shape, thereby forming the first structure layer 208 which constitutes a part of the structure body and the semiconductor layer 209 which constitutes a part of the semiconductor element (see FIG. 6B). The first structure layer 208 and the semiconductor layer 209 can be processed by photolithography and etching similarly to the method described in Embodiment Mode 1.

The thicknesses of the first semiconductor layer 210 and the second semiconductor layer 211 forming the first structure layer 208 are determined by considering various factors similarly to the case described in Embodiment Mode 1. Since a plurality of semiconductor layers is stacked in this embodiment mode, the thicknesses are preferably determined by considering their mechanical strength, internal stress, and the like.

Subsequently, a second conductive layer 212 is formed over the second semiconductor layer 211 which is formed of an amorphous semiconductor layer to which an impurity imparting n-type conductivity or an impurity imparting p-type conductivity is added (in this embodiment mode, the amorphous semiconductor to which the impurity imparting n-type conductivity is added). The second conductive layer 212 can be formed by forming and processing a layer of a conductive metal element, a compound thereof, or the like similarly to Embodiment Mode 1. In this embodiment mode, the second conductive layer 212 which is formed over the first structure layer 208 is referred to as a second structure layer when it functions as a structure layer.

Since the second conductive layer 212 is a conductive layer connected to a source electrode or a drain electrode of the semiconductor element or the structure layer, it can be processed so as to form electrical connection relationship for forming the micromachine. In this case, the second conductive layer 212 is not formed over a portion which serves as a channel region of the semiconductor element. Then, the second semiconductor layer 211 and the first semiconductor layer 210 are partly removed by etching with the use of the second conductive layer 212 as a mask, thereby forming a channel region 213 of the semiconductor element (see FIG. 7A). In this embodiment mode, an n-type semiconductor element 214 is formed through the above steps (see FIG. 7A). Here, a transistor is formed as the semiconductor element 214. The transistor is an inverted staggered thin film transistor with a channel etch structure.

<Second Insulating Layer 215>

Figure 7A:
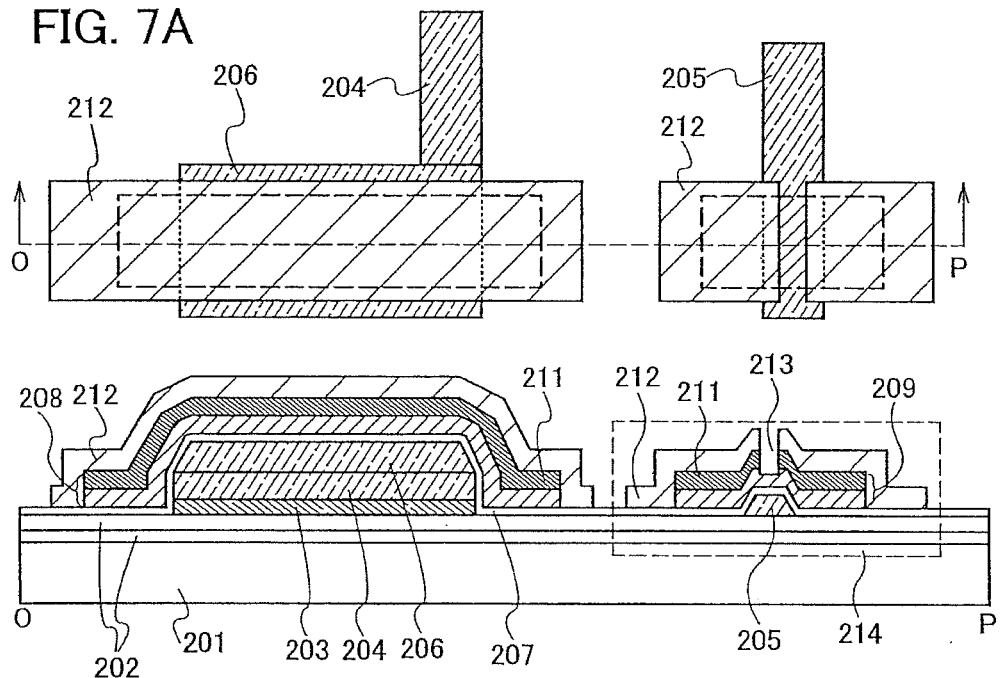
FIGS. 7A and 7B are diagrams illustrating a method for manufacturing a micromachine of the present invention.
Figure 7B:
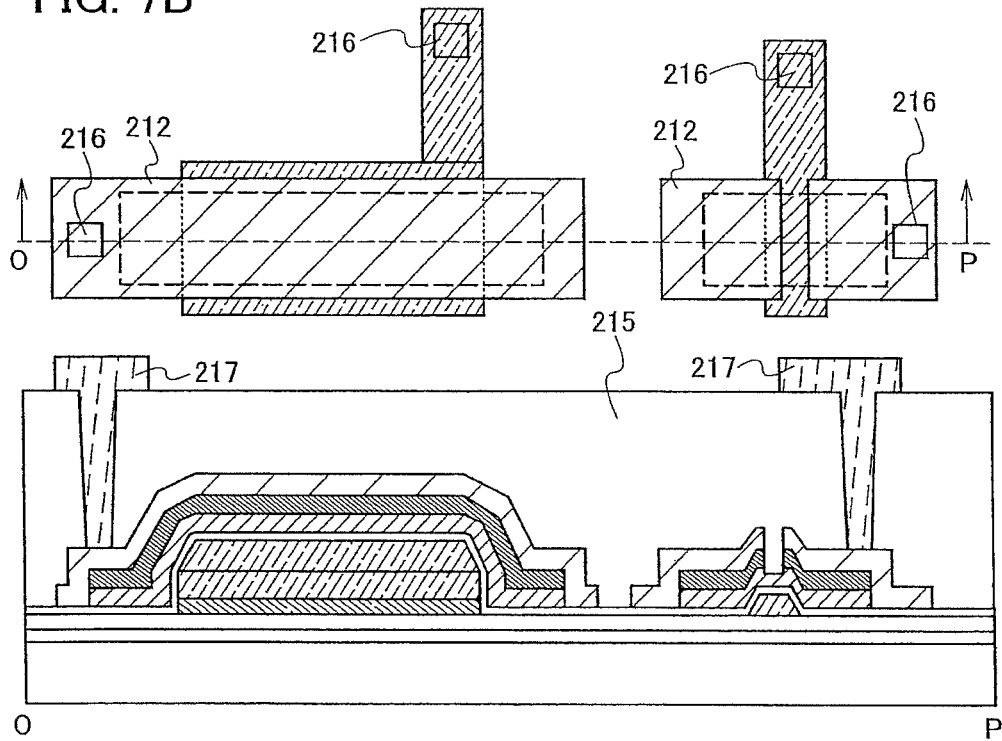

Next, a second insulating layer 215 is formed so as to cover the n-type semiconductor element 214 and a portion to be the structure body (see a lower diagram of FIG. 7B). The second insulating layer 215 can be formed using an insulating inorganic compound, organic compound, or the like similarly to the method described in the above embodiment mode.

<First Contact Hole 216>

Next, the second insulating layer 215 is etched to form a first contact hole 216 (see an upper diagram of FIG. 7B). The etching treatment at this time can be performed by dry etching or wet etching. This embodiment mode describes an example of forming the first contact hole 216 by anisotropic dry etching.

<Third Conductive Layer 217 (Wiring)>

Then, a third conductive layer 217 is formed over the second insulating layer 215 and in the first contact hole 216. The third conductive layer 217 can be formed by forming a layer of a conductive metal element or a compound thereof and processing the layer into a predetermined shape similarly to the second conductive layer 212 and the method described in the above embodiment mode. The second conductive layer 212 can be electrically connected to the source electrode and the drain electrode of the semiconductor element, but not to the gate electrode. Therefore, the source electrode or the drain electrode can be connected to the gate electrode using the third conductive layer 217.

At the same time as the steps of forming the first contact hole 216 and the third conductive layer 217, some processing for forming the structure body may be performed. For example, a part of the second insulating layer 215 over the first sacrifice layer 204, the second sacrifice layer 206, the first structure layer 208, and the second structure layer (the second conductive layer 212) may also be removed by etching at the time of forming the first contact hole 216. Thus, the third conductive layer 217 can be formed thereover. In addition, the processing of removing a part of the second conductive layer 212 formed over the structure layer 208 can also be performed.

<Opening 218>

Figure 8A:
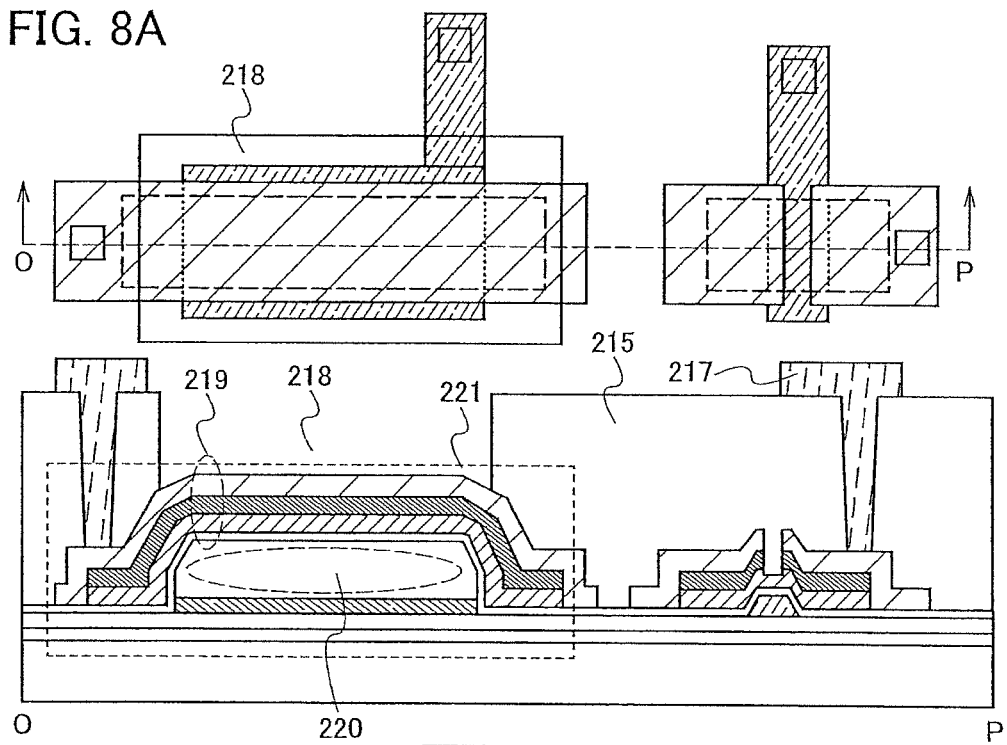
FIGS. 8A and 8B are diagrams illustrating a method for manufacturing a micromachine of the present invention.

Next, an opening 218 is formed in the second insulating layer 215 similarly to the above embodiment mode for sacrifice layer etching (see FIG. 8A). The opening 218 can be formed by laser processing, dry etching, wet etching, or the like. Here, the opening 218 is formed in order to remove the sacrifice layers and manufacture the structure body. Therefore, as described in Embodiment Mode 1 with reference to FIGS. 4A and 4B, when an edge portion of the first sacrifice layer 204, an edge portion of the structure layer 208, and the second conductive layer 212 are electrically connected to the third conductive layer 217 through the first contact hole 216, the opening 218 is preferably formed so that the connection portion and a periphery thereof remain.

Similarly to Embodiment Mode 1, a third insulating layer can be formed over the second insulating layer 215 and the third conductive layer 217 before forming the opening 218, in order to protect the semiconductor element fanned over the substrate.

<Sacrifice Layer Etching>

Next, similarly to the above embodiment mode, the first sacrifice layer 204 and the second sacrifice layer 206 are removed by etching through the opening 218 (see a lower diagram of FIG. 8A). By removal of the sacrifice layers through the opening 218 as described above, a structure body 221 can be manufactured to have a structure layer 219 which is a stack of the first structure layer 208 and the second structure layer (second conductive layer 212) and is movable, and a spatial portion 220 between the substrate and the structure layer.

Figure 8B:
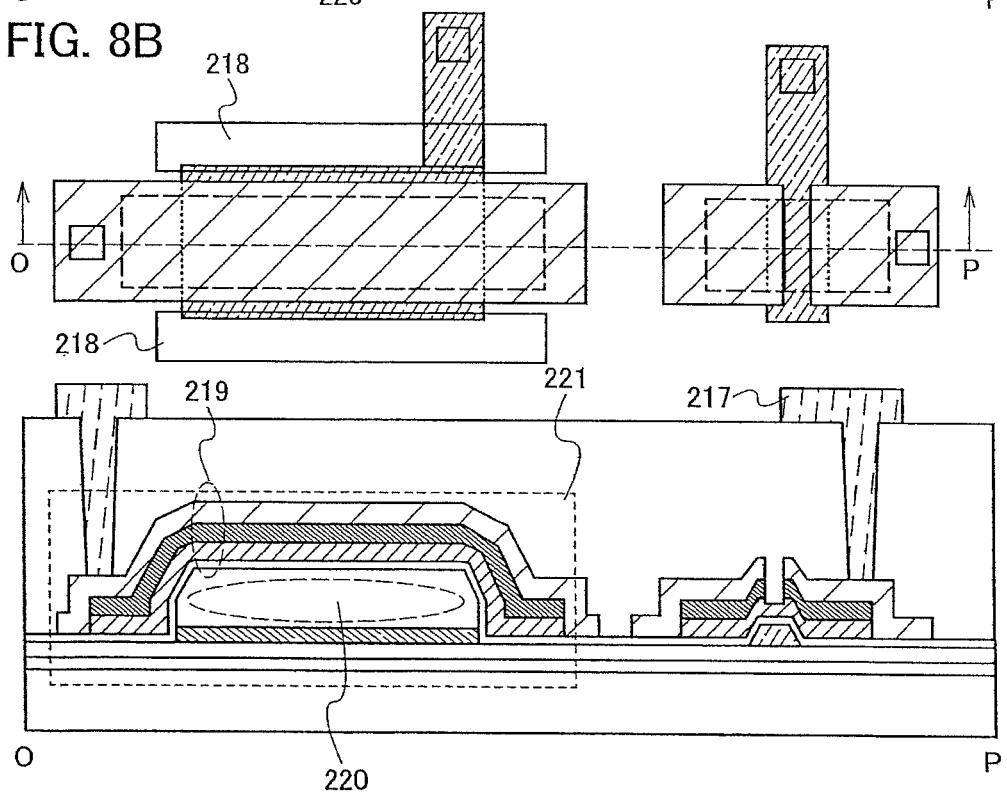

Alternatively, sacrifice layer etching can be performed through an opening which is formed in the second insulating layer 215 over the first sacrifice layer 204 and the second sacrifice layer 206 as shown in FIG. 8B. When the opening 218 is provided so as to leave the second insulating layer 215 over the first structure layer 208 and the second structure layer (second conductive layer 212) as shown, the structure body 221 can be formed to have the structure layer 219 which is a stack of the first structure layer 208, the second structure layer (second conductive layer 212), and the second insulating layer 215, and the spatial portion 220 between the structure layer 219 and the substrate 201 (see a lower diagram of FIG. 8B).

Figure 9A:
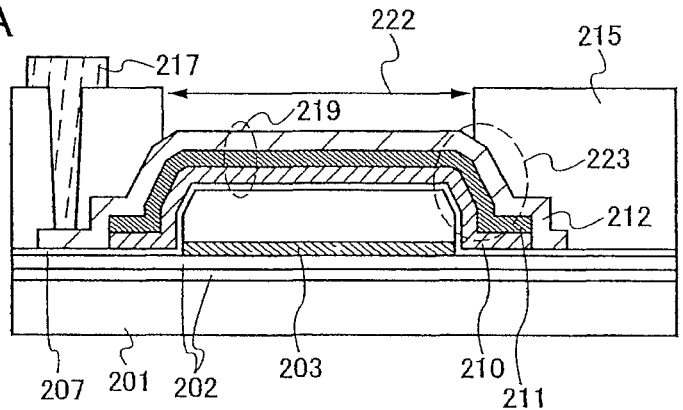
FIGS. 9A to 9D are diagrams illustrating a method for manufacturing a micromachine of the present invention.
Figure 9B:
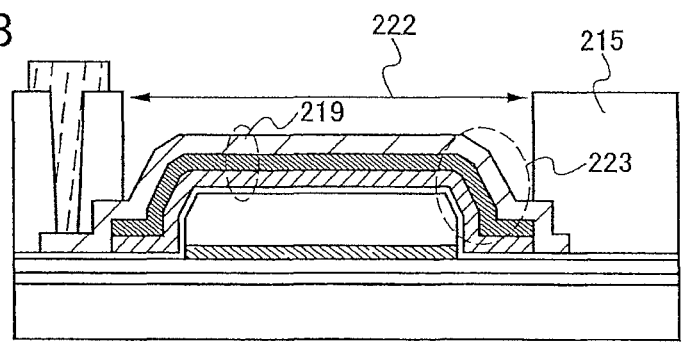

The structure body 221 can be processed into various shapes through final processing, for example, formation of the opening 218, subsequent etching processing, or the like. For example, when the sacrifice layer etching is performed after providing the opening 218 over the structure layer 219 similarly to the case shown in FIG. 8A, the shape of the structure body 221 can be changed depending on whether an opening 222 is formed to be smaller as shown in FIG. 9A or to be larger as shown in FIG. 9B. In specific, when the opening 222 is formed to be small as shown in FIG. 9A, a brace portion 223 of the structure body having a beam structure is fixed to the second insulating layer 215. In this case, the structure layer 219 has a higher spring constant and becomes less fragile because it is fixed to the second insulating layer 215. In contrast, when the opening 222 is formed to be large as shown in FIG. 9B, the brace portion 223 of the structure body is separated from the second insulating layer 215 and becomes thinner. Thus, the structure layer 219 has a smaller spring constant than the above structure and becomes more movable.

Figure 9C:
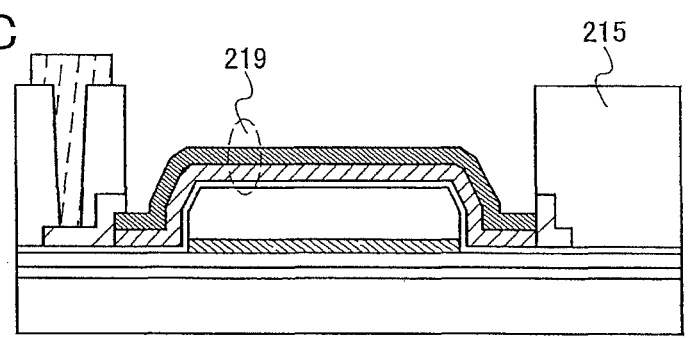

Further, after forming the opening 218 in the second insulating layer 215, a part of the second structure layer (second conductive layer 212) over the first structure layer 208 can be removed by etching as shown in FIG. 9C. Accordingly, the structure layer 219 can be formed by only the first structure layer 208, and the structure layer 219 can be formed to have flexibility unique to silicon.

Figure 9D:
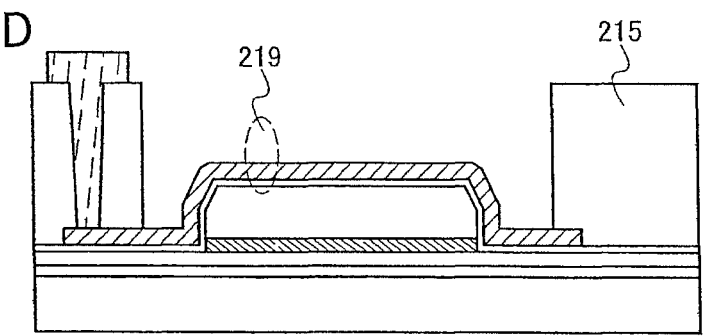

When the structure layer 219 is formed by only a semiconductor as described above, a method, by which the second structure layer (second conductive layer 212) is not formed over the first structure layer 208, can be employed. In this case, the first structure layer 208 is formed after formation of the first semiconductor layer 210 and the second semiconductor layer 211, and the second conductive layer 212 is not formed over the first structure layer 208. Thus, at the time of forming the channel region of the semiconductor element, the second semiconductor layer 211 to which an impurity is added is removed by etching. Therefore, the structure layer 219 of the structure body shown in FIG. 9D is thinner than the structure layer 219 shown in FIG. 9C, and a structure body with high movability can be manufactured.

Further, as described in Embodiment Mode 1, an opposite substrate can be attached to seal the manufactured micromachine or form a multilayer wiring.

Through the above steps, a micromachine which includes a structure body and a semiconductor element over one substrate can be manufactured. The micromachine of this embodiment mode does not require assembly and packaging steps because the structure body and the semiconductor element are manufactured over one substrate. Further, the micromachine can be miniaturized by manufacturing of them over one substrate and by formation and connection of a conductive layer with the use of an opposite substrate.

Note that this embodiment mode can be freely combined with Embodiment Mode 1.

Embodiment Mode 3

This embodiment mode describes an example of manufacturing a micromachine which includes a structure body and an electric circuit having a semiconductor element over one substrate by using a method different from those in Embodiment Modes 1 and 2. A micromachine and its manufacturing method of this embodiment mode are described with reference to cross-sectional views shown in FIGS. 10 to 20C. Each drawing shows a structure body on the left side (a region 312 where a structure body is to be manufactured) and a semiconductor element on the right side (a region 313 where a semiconductor element is to be manufactured). In this embodiment mode, a thin film transistor which includes gate electrodes above and below a semiconductor layer is formed as the semiconductor element. This embodiment mode describes an example of manufacturing two semiconductor elements in the region 313 where a semiconductor element is to be manufactured. A left semiconductor element is an n-channel transistor and a right semiconductor element is a p-channel transistor.

Figure 10:
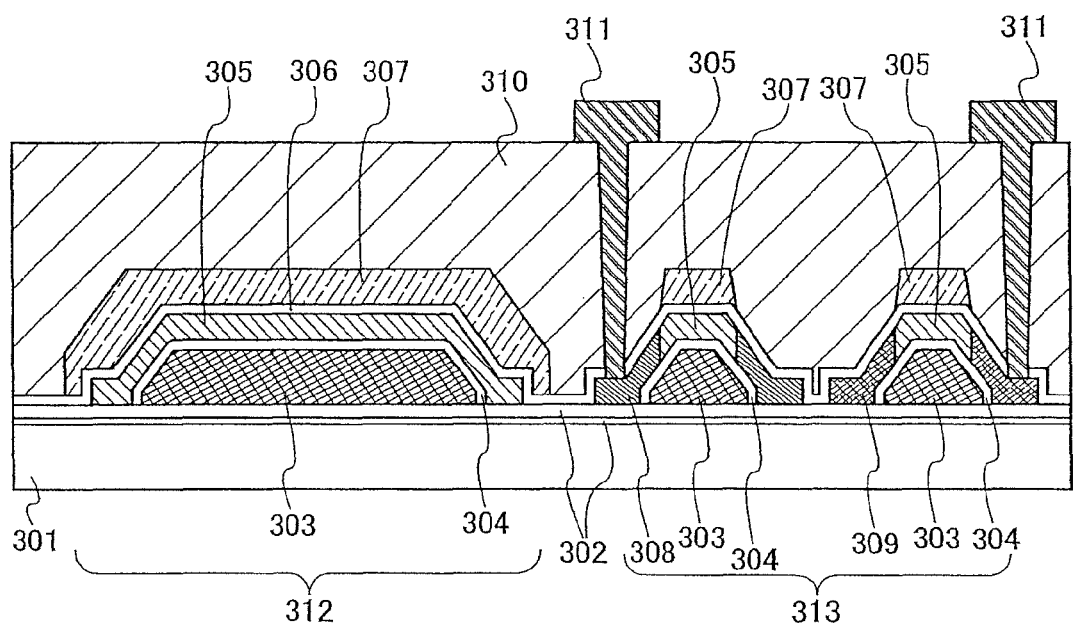
FIG. 10 is a diagram illustrating a method for manufacturing a micromachine of the present invention.

This embodiment mode describes an example of manufacturing the structure body at the same time as manufacturing the semiconductor elements each including gate electrodes above and below a semiconductor layer. Therefore, in the manufacturing method of the micromachine of this embodiment mode, a base layer 302, a first, conductive layer 303, a first insulating layer 304, a semiconductor layer 305, a second insulating layer 306, and a second conductive layer 307 are formed over a substrate 301, and an impurity is then added to the semiconductor layer, thereby manufacturing the semiconductor elements as shown in FIG. 10. Then, a third insulating layer 310 is formed, a first contact hole is formed in the third insulating layer, and a third conductive layer 311 is formed. FIG. 10 shows a basic cross-sectional view of layers which are stacked in this embodiment mode, before carrying out sacrifice layer etching.

After that, an opening is formed in the third insulating layer 310, and a sacrifice layer is removed by sacrifice layer etching, thereby manufacturing a structure body including a structure layer and a spatial portion. In the manufacturing method of the micromachine of this embodiment mode, each layer may be formed by using a single layer or stacking layers. In particular, a structure layer, a conductive layer for forming a structure body, and a sacrifice layer can be separately formed in various ways depending on a stacked structure of the first conductive layer 303 and the second conductive layer 307.

This embodiment mode describes first an example of a method for manufacturing the above basic structure, and then several examples of separate formation depending on stacking relationship.

The micromachine of the present invention can be manufactured over an insulating substrate similarly to Embodiment Modes 1 and 2. The base layer 302 is formed over the substrate 301 similarly to the base layer 102 of Embodiment Mode 1.

Next, the first conductive layer 303 is formed over the base layer 302. The first conductive layer 303 in the region 312 where a structure body is to be formed is used as a layer which constitutes a part of the structure body, and a sacrifice layer. On the other hand, the first conductive layer 303 in the region 313 where a semiconductor element is to be formed serves as a first gate electrode. The first conductive layer 303 can be formed by forming and processing a film of a conductive material similarly to the above embodiment modes. The first conductive layer 303 can also be processed to have a taper angle as shown.

Next, the first insulating layer 304 is formed over the first conductive layer 303. The first insulating layer 304 in the region 313 where a semiconductor element is to be formed serves as a gate insulating layer. The first insulating layer 304 may be formed using a material including silicon, such as silicon oxide or silicon nitride by a plasma CVD method, a sputtering method, or the like as described in the above embodiment modes. Further, it can also be formed using metal oxide or metal nitride which is formed by oxidizing or nitriding the surface of the first conductive layer 303 by plasma treatment, an anodic oxidation method, or the like. By oxidation or nitridation of the metal surface, a uniform layer can be formed.

Next, the semiconductor layer 305 is formed over the first insulating layer 304. The semiconductor layer 305 may be formed by forming a layer including silicon and then crystallizing the layer by thermal crystallization as described in Embodiment Mode 1. Alternatively, it may be formed by stacking a plurality of semiconductor layers as described in Embodiment Mode 2. This embodiment mode describes an example of forming the semiconductor layer 305 by film formation, crystallization, and impurity addition similarly to Embodiment Mode 1. FIG. 10 shows an example of forming two types of semiconductor elements by forming a first impurity region 308 to which an impurity imparting n-type conductivity is added and a second impurity region 309 to which an impurity imparting p-type conductivity is added. The semiconductor layer 305 in the region 312 where a structure body is to be formed is used as a layer which constitutes a part of the structure body, and a sacrifice layer.

Next, the second insulating layer 306 is formed over the first insulating layer 304 and the semiconductor layer 305. The second insulating layer 306 in the region 313 where a semiconductor element is to be formed serves as a gate insulating layer. The second insulating layer 306 can be formed using a material including silicon such as silicon oxide or silicon nitride by a plasma CVD method, a sputtering method, or the like similarly to the first insulating layer 304.

Then, the second conductive layer 307 is formed over the second insulating layer 306. The second conductive layer 307 can be formed similarly to the first conductive layer 303. The second conductive layer 307 in the region 312 where a structure body is to be formed is used as a layer which constitutes a part of the structure body, and a sacrifice layer. On the other hand, the second conductive layer 307 in the region 313 where a semiconductor element is to be formed serves as a second gate electrode.

Next, the third insulating layer 310 is formed over the second insulating layer 306 and the second conductive layer 307. The third insulating layer 310 functions to reduce parasitic capacitance by insulating the semiconductor element from a wiring to be formed thereover, and can be formed using an insulating inorganic compound, organic compound, or the like similarly to the methods described in the above embodiment modes.

Next, the third insulating layer 310 is etched, thereby forming a first contact hole. The etching treatment at this time can be performed by dry etching or wet etching.

Next, the third conductive layer 311 is formed using a conductive metal element or a compound thereof over the third insulating layer 310 and in the first contact hole. The third conductive layer 311 in the region where a semiconductor element is to be formed serves as a wiring for connecting a source electrode, a drain electrode, and a gate electrode. In addition, the third conductive layer 311 may also serve as a wiring for connecting the structure body and the semiconductor element to each other.

Each of the layers formed as described above can be formed by using a single layer of a single material or by stacking layers of a plurality of materials.

Each of the layers formed in the above steps can be processed by etching using as a mask a photosensitive resist which is applied over the layer and processed into an arbitrary shape by a photolithography method. This etching step may be performed by either dry etching using a gas etchant or wet etching using a liquid etchant, which is preferably selected appropriately depending on film formation and processing conditions. For example, anisotropic dry etching can be employed in a case of forming a conductive layer or a contact hole, whereby the layer can be processed perpendicularly. In sacrifice layer etching, isotropic wet etching can be employed to remove the sacrifice layer located below the structure layer.

In a case of stacking layers of a plurality of materials, the layers may be formed by repeating film formation and processing. Alternatively, a plurality of layers may be successively formed and then processed simultaneously in a self-aligned manner.

Described next are several examples of methods for separately forming structure bodies having different structures by stacking the first conductive layer 303 and the second conductive layer 307 in various ways.

Structural Example 1 of Structure Body

Figure 11A:
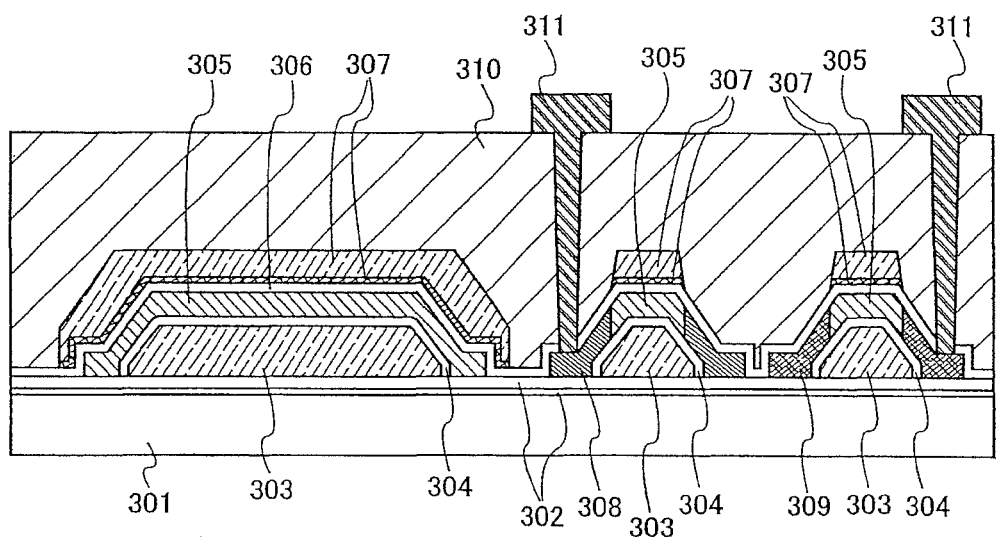
FIGS. 11A to 11C are diagrams illustrating a method for manufacturing a micromachine of the present invention.
Figure 11B:
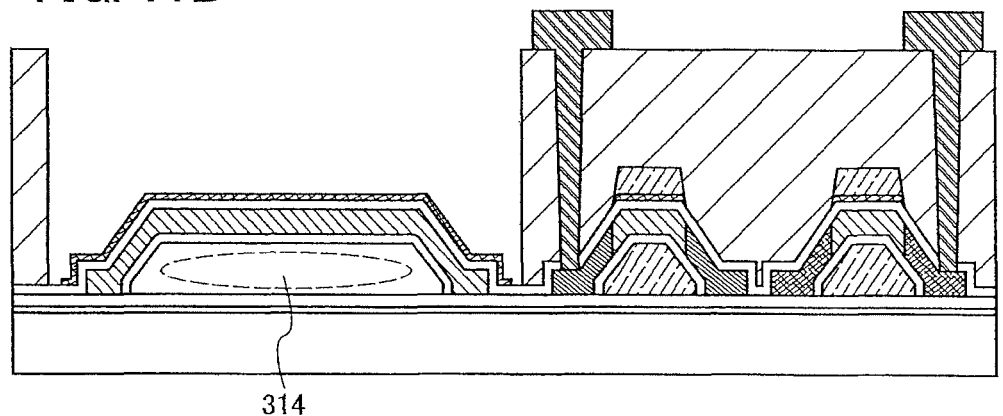
Figure 11C:
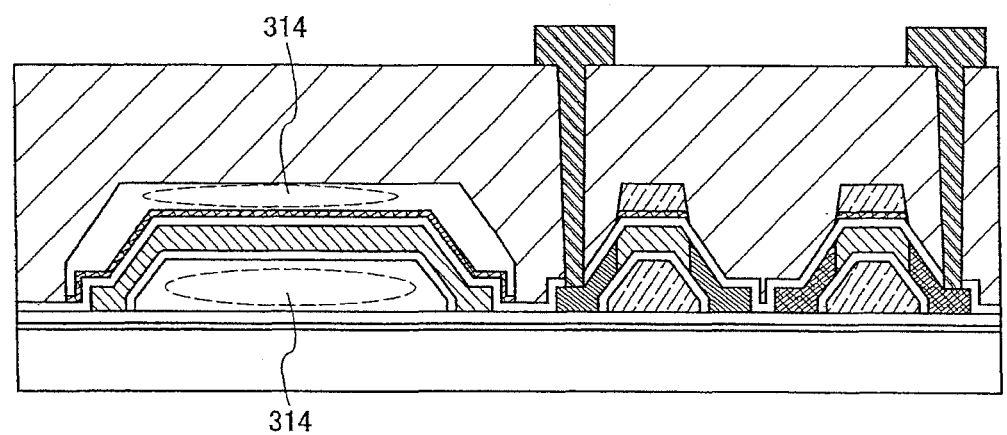

A first example is shown in FIGS. 11A to 11C. In this example, the first conductive layer 303 is formed with a single-layer structure, and the second conductive layer 307 is formed with a stacked structure of two layers, upper and lower layers, as shown in FIG. 11A. The first conductive layer 303 and the upper layer of the second conductive layer 307 serve as sacrifice layers. Then, an opening is formed by removing the third insulating layer 310 in the region 312 where a structure body is to be formed, and sacrifice layer etching is carried out. Accordingly, a structure body which includes a spatial portion 314 below the semiconductor layer 305 can be formed as shown in FIG. 11B. Alternatively, an opening may be formed in a portion which is over the first conductive layer 303 and the second conductive layer 307 but not over the semiconductor layer 305. Accordingly, a structure body including spatial portions 314 above and below the semiconductor layer 305 can be formed as shown in FIG. 11C.

In this example, a structure layer which is a stack of the first insulating layer 304, the semiconductor layer 305, the second insulating layer 306, and the lower layer of the second conductive layer 307 can be formed. Since such a structure layer has a stacked structure of a conductive layer and an insulating layer, it is movable like bimetal when a current flows through the conductive layer utilizing, for example, a difference in thermal expansion coefficient. In addition, the structure layer can be used for a structure body which detects warpage of the structure layer due to external force by detecting a change in resistance of the conductive layer.

Structural Example 2 of Structure Body

Figure 12A:
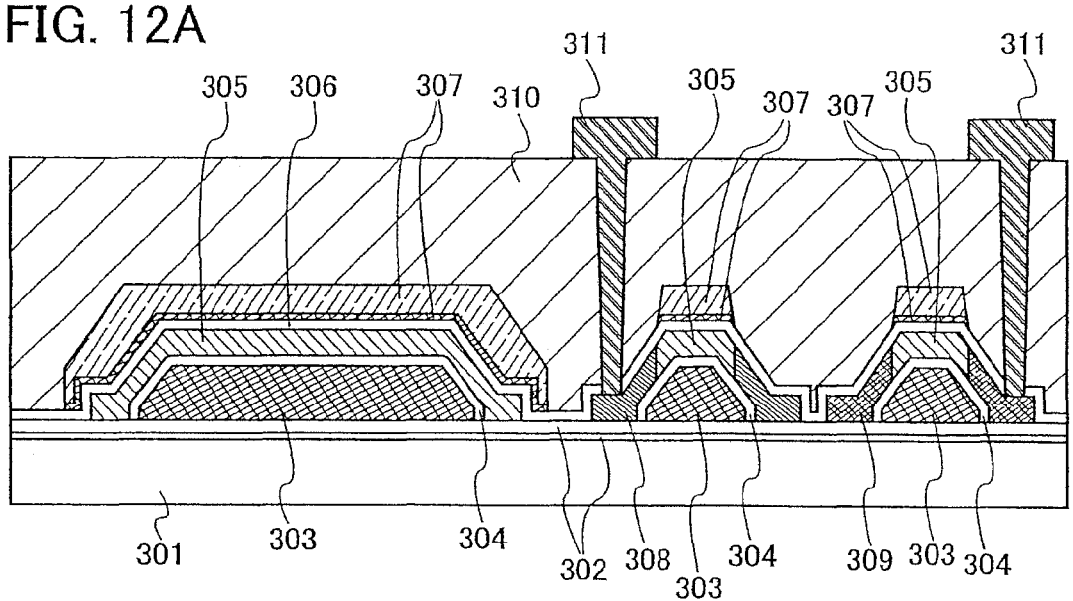
FIGS. 12A and 12B are diagrams illustrating a method for manufacturing a micromachine of the present invention.
Figure 12B:
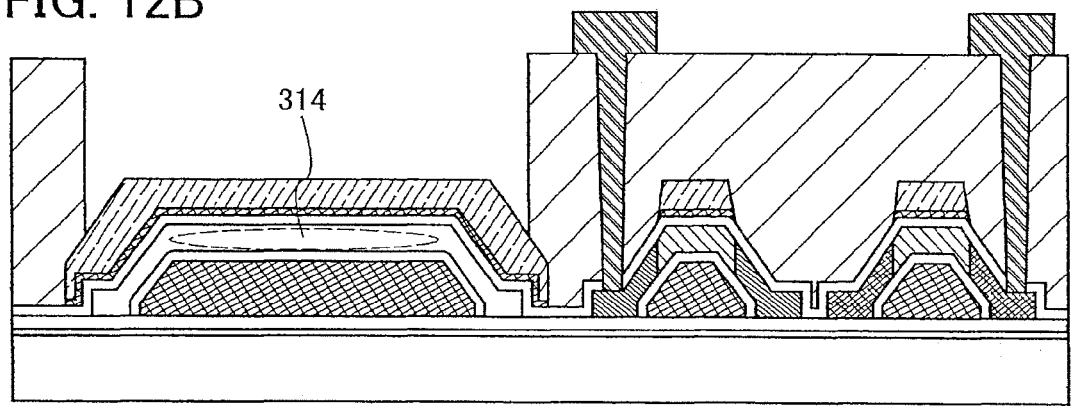

Next, a second example is shown in FIGS. 12A and 12B. In this example, the first conductive layer 303 is formed with a single-layer structure, the second conductive layer 307 is formed with a single-layer or stacked structure as shown in FIG. 12A, and the semiconductor layer 305 is used as a sacrifice layer. Then, an opening is formed by removing the third insulating layer 310 in the region where a structure body is to be formed, and sacrifice layer etching is performed. Accordingly, a structure body which includes the spatial portion 314 between the first conductive layer 303 and the second conductive layer 307 can be formed as shown in FIG. 12B. In the structure body formed as described above, the first conductive layer 303 serves as a fixed electrode, the second insulating layer 306 and the second conductive layer 307 serve as a structure layer, and the second conductive layer 307 serves as a movable electrode.

FIGS. 12A and 12B show a case where the second conductive layer 307 has a stacked structure of two layers, an upper layer and a lower layer. A structure body with arbitrary hardness can be formed by stacking of different kinds of materials. However, the structure body is not limited to this example, and the second conductive layer 307 may be formed using a single layer of a single material or stacking layers of a plurality of materials.

Structural Example 3 of Structure Body

Figure 13A:
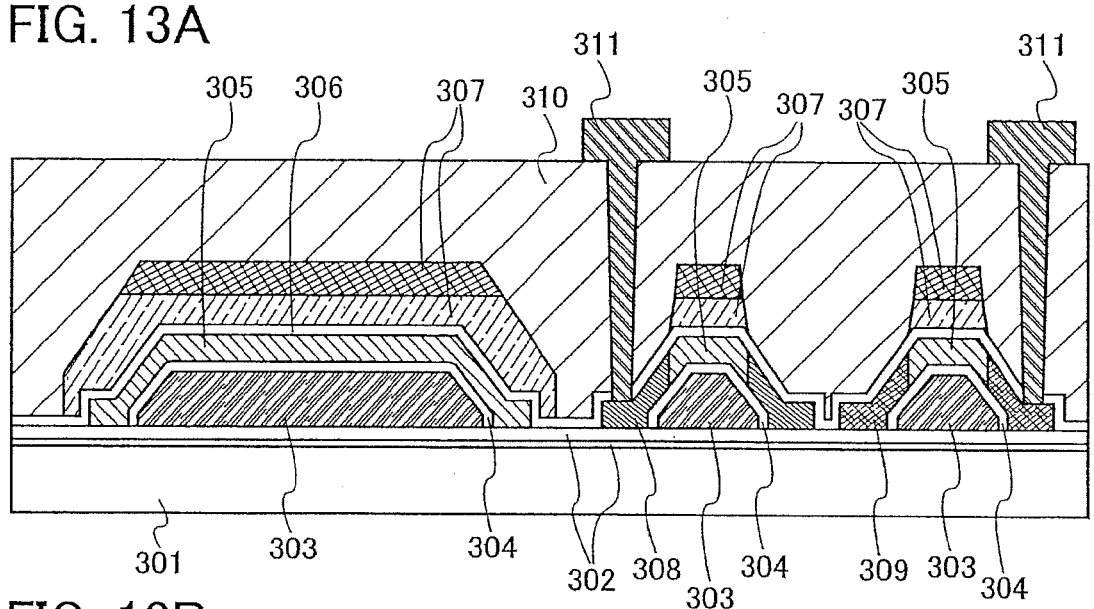
FIGS. 13A and 13B are diagrams illustrating a method for manufacturing a micromachine of the present invention.
Figure 13B:
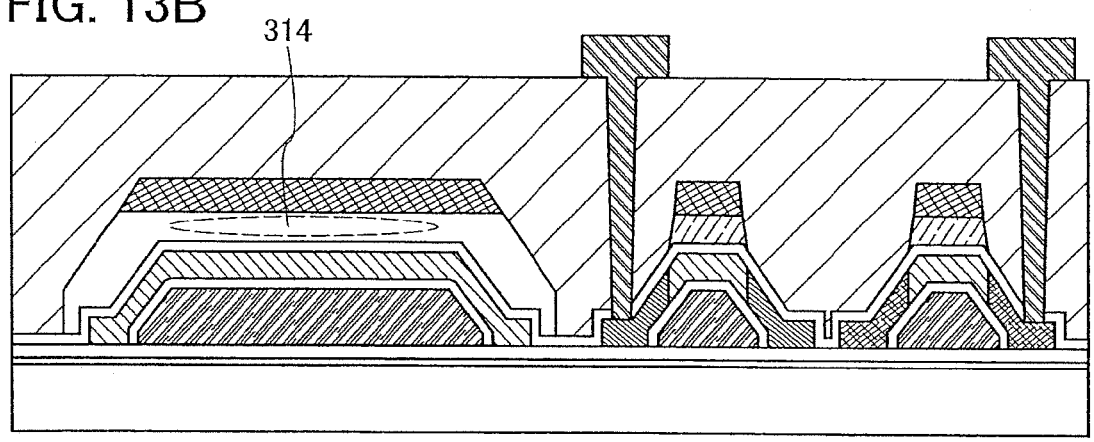

A third example is shown in FIGS. 13A and 13B. In this example, the first conductive layer 303 is formed with a single layer, and the second conductive layer 307 is formed with two layers, an upper layer and a lower layer, as shown in FIG. 13A, and the lower layer of the second conductive layer 307 is used as a sacrifice layer. Then, an opening is formed by removing the third insulating layer 310 and the second conductive layer 307 except in the region where a structure body is to be formed, and sacrifice layer etching is carried out. Accordingly, a structure body which includes the spatial portion 314 can be formed as shown in FIG. 13B. In the structure body formed as described above, the first conductive layer 303 serves as a fixed electrode, and the upper layer of the second conductive layer 307 and the third insulating layer 310 serve as a structure layer.

In addition, FIGS. 13A and 13B show an example of forming a structure body in which the upper layer of the second conductive layer 307 forms the structure layer by changing the method for forming the second conductive layer 307. In this case, the upper layer and the lower layer of the second conductive layer 307 may be separately formed and processed so that the upper layer of the second conductive layer 307 covers the lower layer.

Structural Example 4 of Structure Body

Figure 14A:
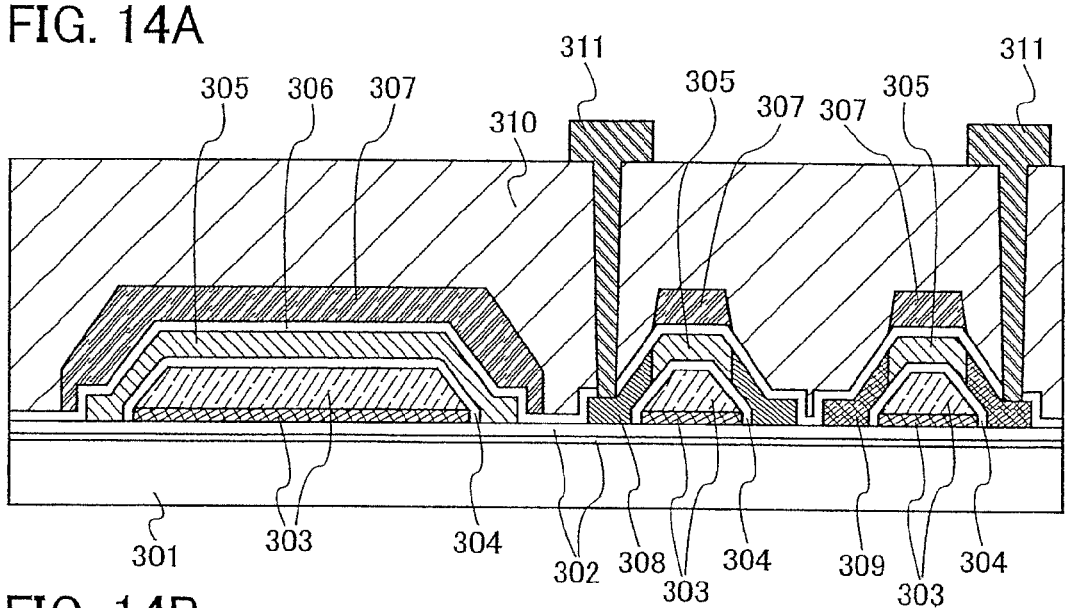
FIGS. 14A and 14B are diagrams illustrating a method for manufacturing a micromachine of the present invention.
Figure 14B:
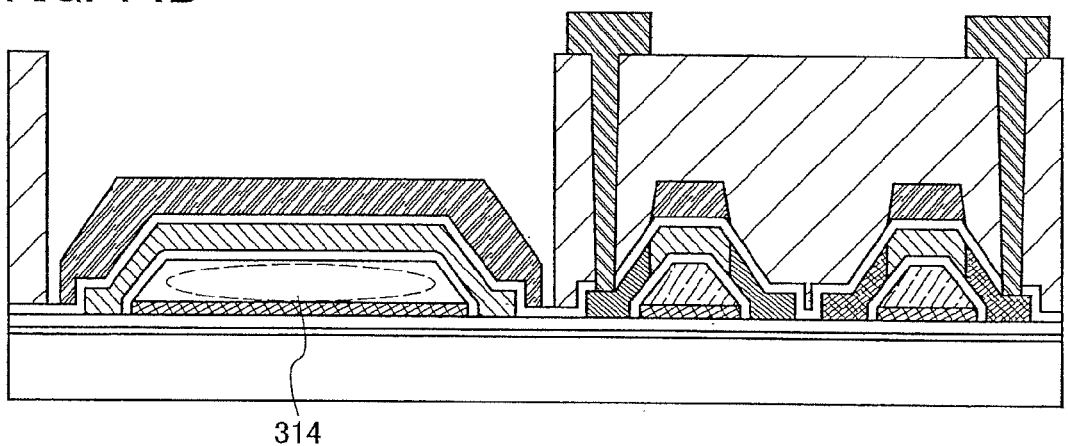

A fourth example is shown in FIGS. 14A and 14B. In this example, the first conductive layer 303 is formed with two layers, an upper layer and a lower layer, and the second conductive layer 307 is formed with a single layer as shown in FIG. 14A, and the upper layer of the first conductive layer 303 is used as a sacrifice layer. Then, an opening is formed by removing the third insulating layer 310 in the region 312 where a structure body is to be formed, and sacrifice layer etching is carried out. Accordingly, a structure body which includes the spatial portion 314 can be formed as shown in FIG. 14B. In the structure body formed as described above, the lower layer of the first conductive layer 303 serves as a fixed electrode, and the first insulating layer 304, the semiconductor layer 305, the second insulating layer 306, and the second conductive layer 307 serve as a structure layer.

Structural Example 5 of Structure Body

Figure 15A:
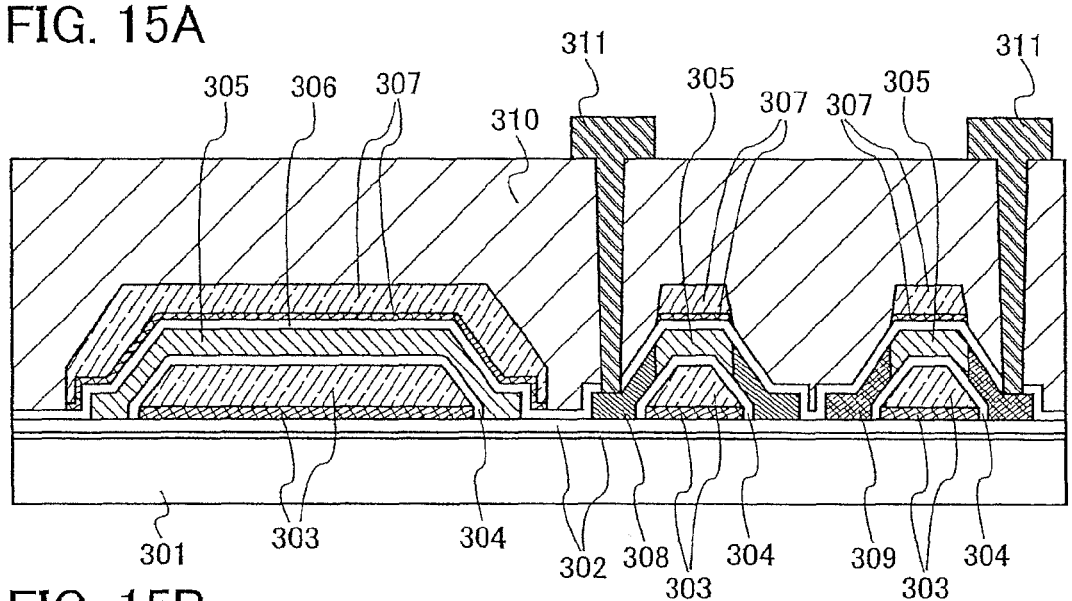
FIGS. 15A and 15B are diagrams illustrating a method for manufacturing a micromachine of the present invention.
Figure 15B:
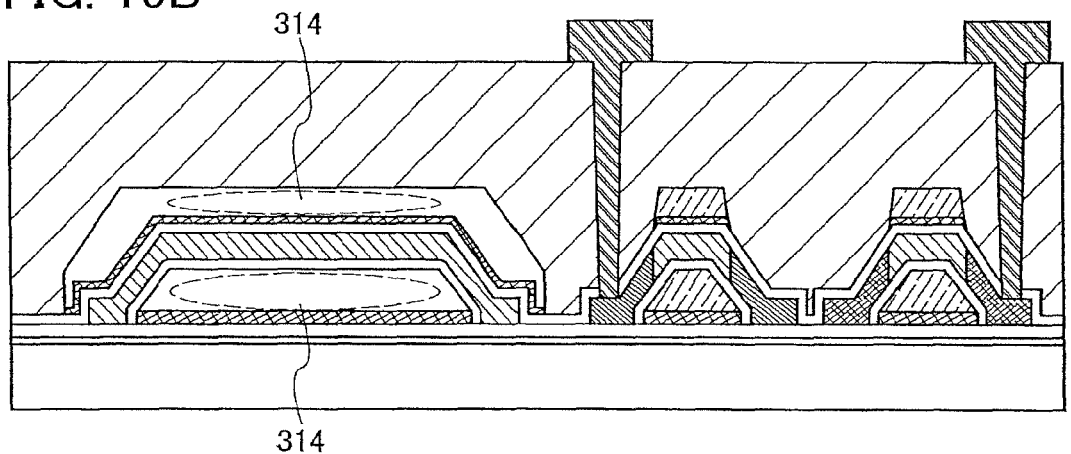

A fifth example is shown in FIGS. 15A and 15B. In this example, each of the first conductive layer 303 and the second conductive layer 307 is formed with two layers, an upper layer and a lower layer, as shown in FIG. 15A, and the upper layer of the first conductive layer 303 and the upper layer of the second conductive layer 307 are used as sacrifice layers. Then, an opening is formed by removing the third insulating layer 310 in the region where a structure body is to be formed, and sacrifice layer etching is carried out. Accordingly, a structure body can be formed. In the structure body formed as described above, the lower layer of the first conductive layer 303 serves as a fixed electrode, and the first insulating layer 304, the semiconductor layer 305, the second insulating layer 306, and the lower layer of the second conductive layer 307 serve as a structure layer. Alternatively, an opening may be formed by removing the third insulating layer 310 except in the region where a structure body is to be formed, and sacrifice layer etching may be carried out. Accordingly, a structure body which includes the spatial portions 314 above and below the structure layer can be formed as shown in FIG. 15B.

Structural Example 6 of Structure Body

Figure 16A:
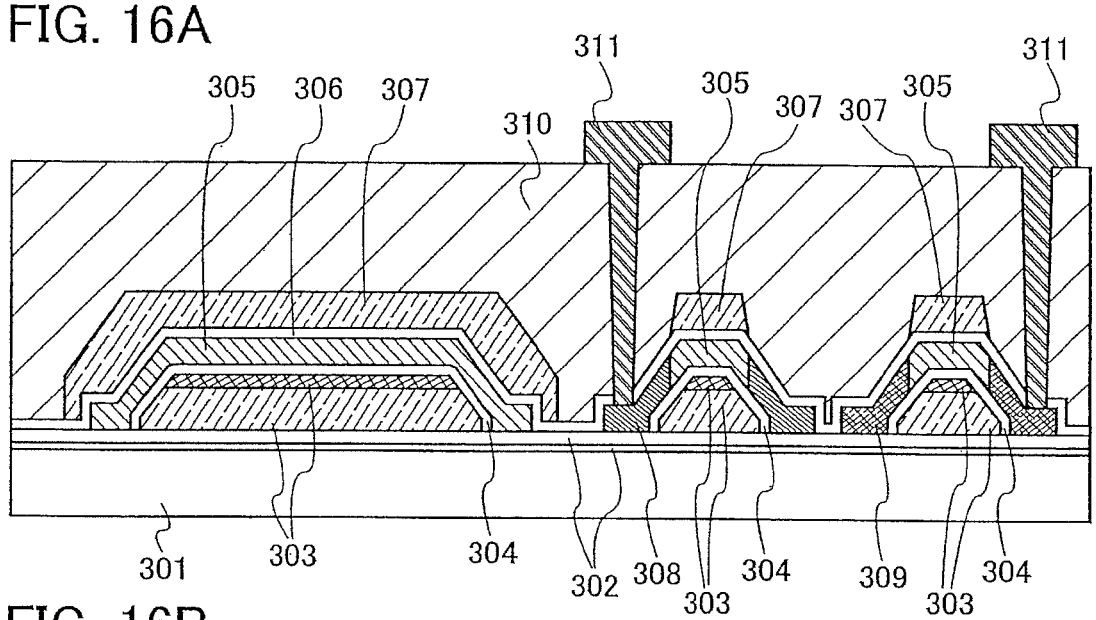
FIGS. 16A and 16B are diagrams illustrating a method for manufacturing a micromachine of the present invention.
Figure 16B:
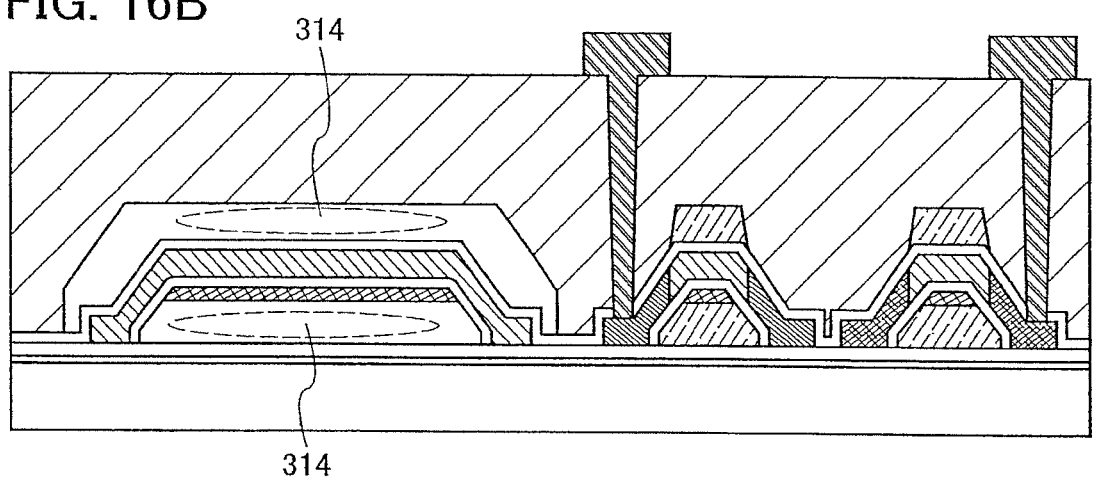

A sixth example is shown in FIGS. 16A and 16B. In this example, the first conductive layer 303 is formed with two layers, an upper layer and a lower layer, and the second conductive layer 307 is formed with a single layer as shown in FIG. 16A, and the lower layer of the first conductive layer 303 and the second conductive layer 307 are used as sacrifice layers. Then, an opening is formed by removing the third insulating layer 310 except in the region where a structure body is to be formed, and sacrifice layer etching is carried out. Accordingly, a structure body which includes the spatial portions 314 above and below the structure layer can be formed as shown in FIG. 16B. In the structure body formed as described above, there is no fixed electrode, and the upper layer of the first conductive layer 303, the first insulating layer 304, the semiconductor layer 305, and the second insulating layer 306 serve as a structure layer. Alternatively, also in this example, an opening may be formed by removing the third insulating layer 310 over the structure layer, and sacrifice layer etching may be carried out, thereby forming a structure body.

Structural Example 7 of Structure Body

Figure 17A:
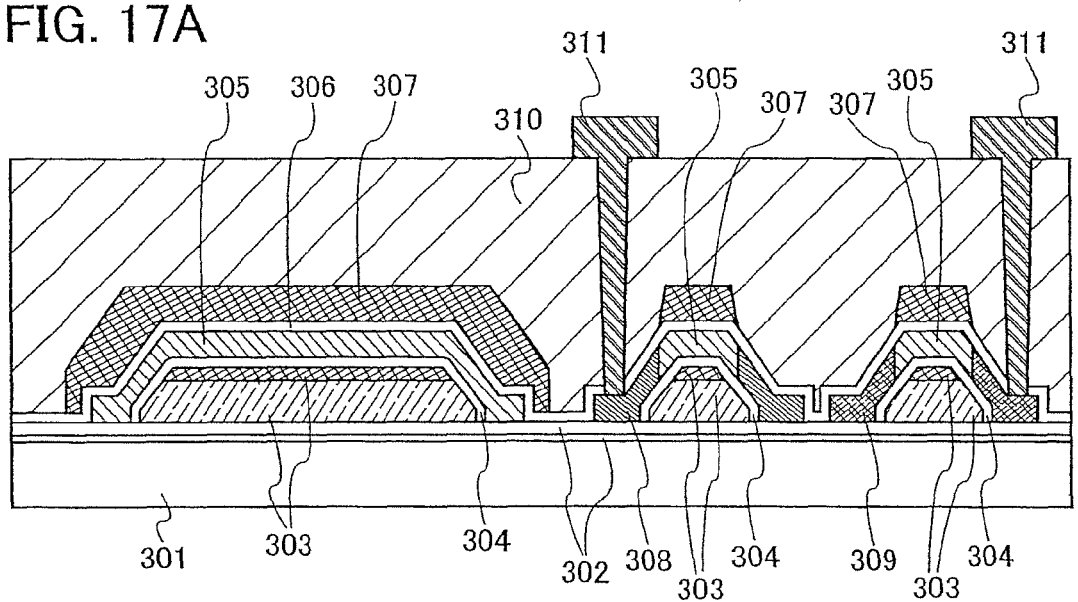
FIGS. 17A and 17B are diagrams illustrating a method for manufacturing a micromachine of the present invention.
Figure 17B:
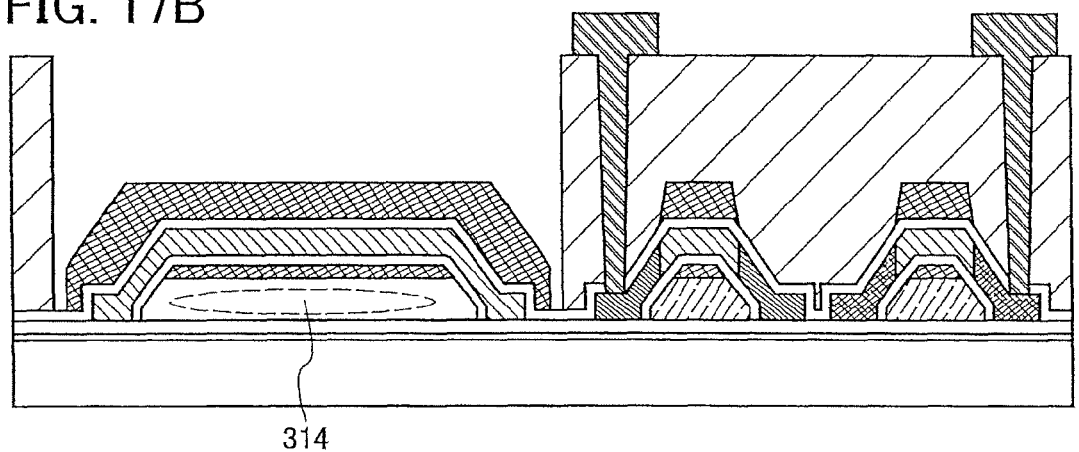

A seventh example is shown in FIGS. 17A and 17B. In this example, the first conductive layer 303 and the second conductive layer 307 are formed as shown in FIG. 17A similarly to Structural Example 6, and the lower layer of the first conductive layer 303 is used as a sacrifice layer. Then, an opening is formed by removing the third insulating layer 310 in the region where a structure body is to be formed, and sacrifice layer etching is carried out. Accordingly, a structure body which includes the spatial portion 314 below the structure layer can be formed as shown in FIG. 17B.

In the structure body formed as described above, there is no fixed electrode, and the upper layer of the first conductive layer 303, the first insulating layer 304, the semiconductor layer 305, the second insulating layer 306, and the second conductive layer 307 serve a structure layer. For example, the structure body formed as described above can detect the movement of the structure layer according to a difference in strain between the upper and lower conductive layers when the upper layer of the first conductive layer 303 and the second conductive layer 307 are formed using materials having different gauge factors. Further, the structure body can be used as an actuator when bimetal is formed using materials with different thermal expansion coefficients.

Structural Example 8 of Structure Body

Figure 18A:
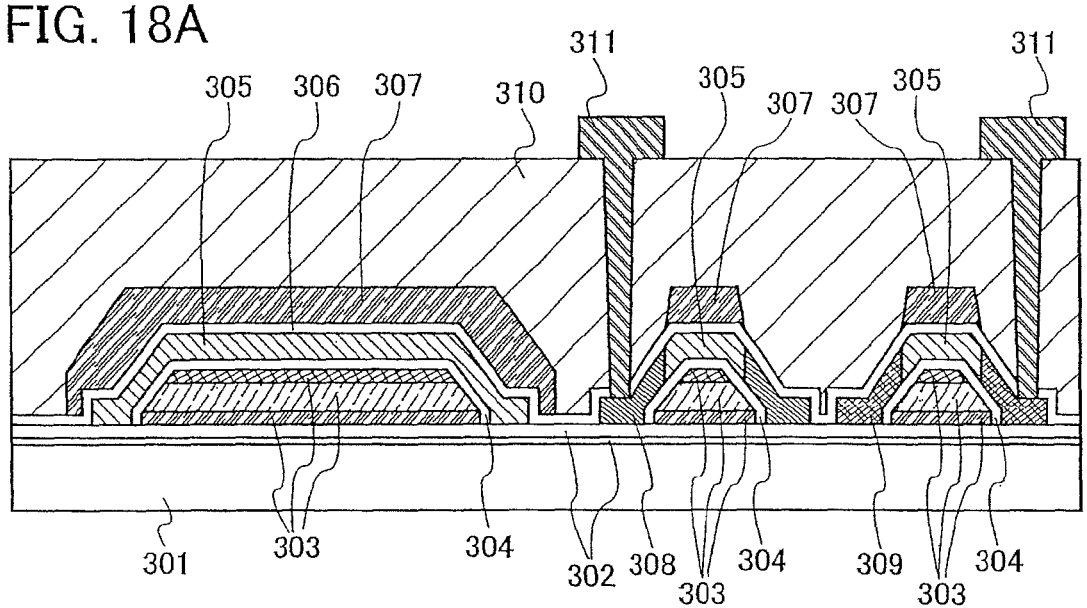
FIGS. 18A and 18B are diagrams illustrating a method for manufacturing a micromachine of the present invention.
Figure 18B:
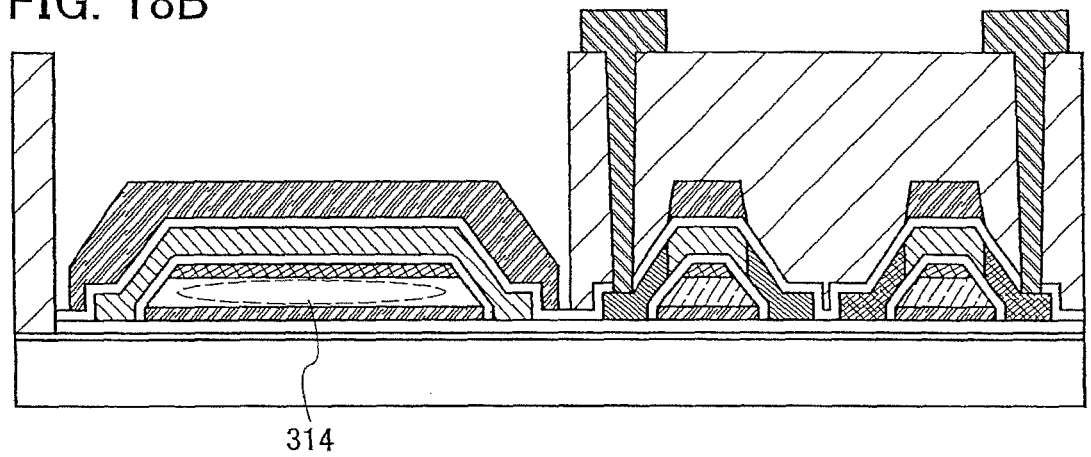

An eighth example is shown in FIGS. 18A and 18B. In this example, the first conductive layer 303 is formed with three layers, an upper layer, an intermediate layer, and a lower layer, the second conductive layer 307 is formed with a single layer or a stacked layer as shown in FIG. 18A, and the intermediate layer of the first conductive layer 303 is used as a sacrifice layer. Then, an opening is formed by removing the third insulating layer 310 in the region where a structure body is to be formed, and sacrifice layer etching is carried out. Accordingly, a structure body which includes the spatial portion 314 below the structure layer can be formed as shown in FIG. 18B. In the structure body formed as described above, the lower layer of the first conductive layer 303 serves as a fixed electrode, and the upper layer of the first conductive layer 303, the first insulating layer 304, the semiconductor layer 305, the second insulating layer 306, and the second conductive layer 307 serve a structure layer.

Structural Example 9 of Structure Body

Figure 19A:
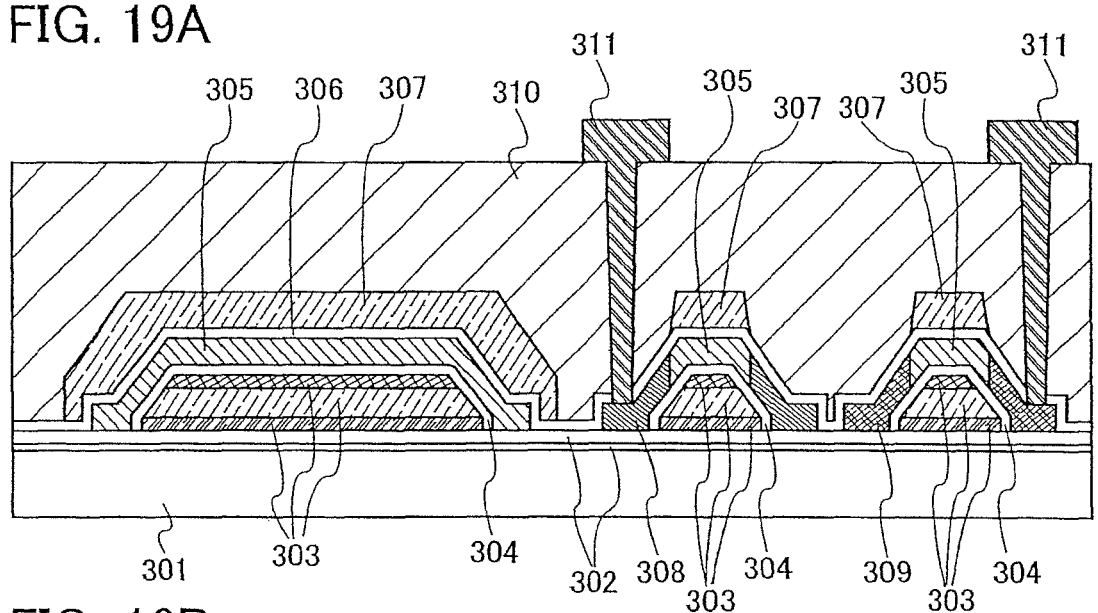
FIGS. 19A and 19B are diagrams illustrating a method for manufacturing a micromachine of the present invention.
Figure 19B:
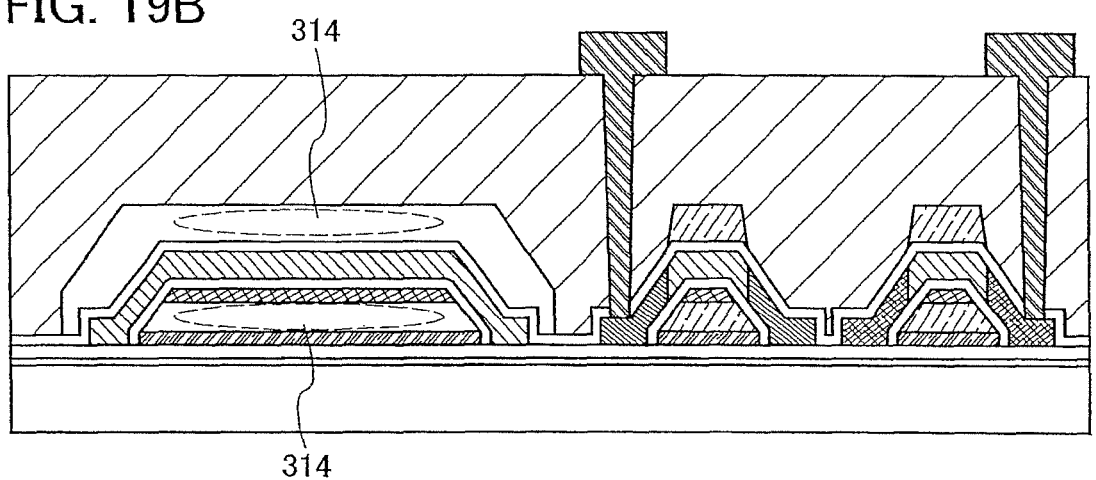

A ninth example is shown in FIGS. 19A and 19B. In this example, the first conductive layer 303 and the second conductive layer 307 are formed similarly to Structural Example 8 as shown in FIG. 19A, and the intermediate layer of the first conductive layer 303 and the second conductive layer 307 are used as sacrifice layers. Then, an opening is formed by removing the third insulating layer 310 except in the region where a structure body is to be formed, and sacrifice layer etching is carried out. Accordingly, a structure body which includes the spatial portions 314 above and below the structure layer can be formed as shown in FIG. 19B. In the structure body formed as described above, the lower layer of the first conductive layer 303 serves as a fixed electrode, and the upper layer of the first conductive layer 303, the first insulating layer 304, the semiconductor layer 305, and the second insulating layer 306 serve as a structure layer. In this example, an opening may alternatively be formed by removing the third insulating layer 310 in the region where a structure body is to be formed, and sacrifice layer etching may be carried out. Accordingly, a structure body which includes the spatial portion 314 below the structure layer can be formed.

Structural Example 10 of Structure Body

Figure 20A:
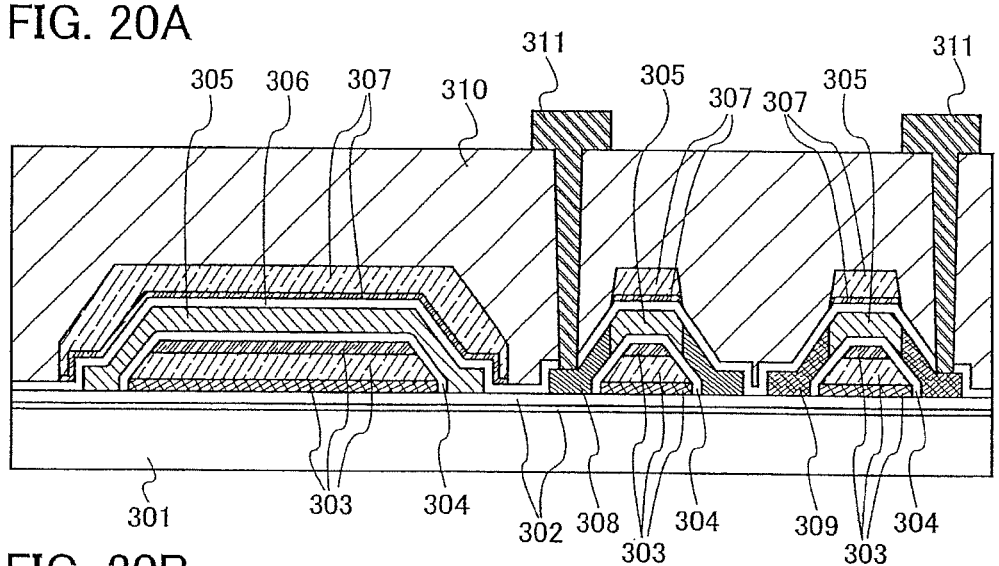
FIGS. 20A to 20C are diagrams illustrating a method for manufacturing a micromachine of the present invention.
Figure 20B:
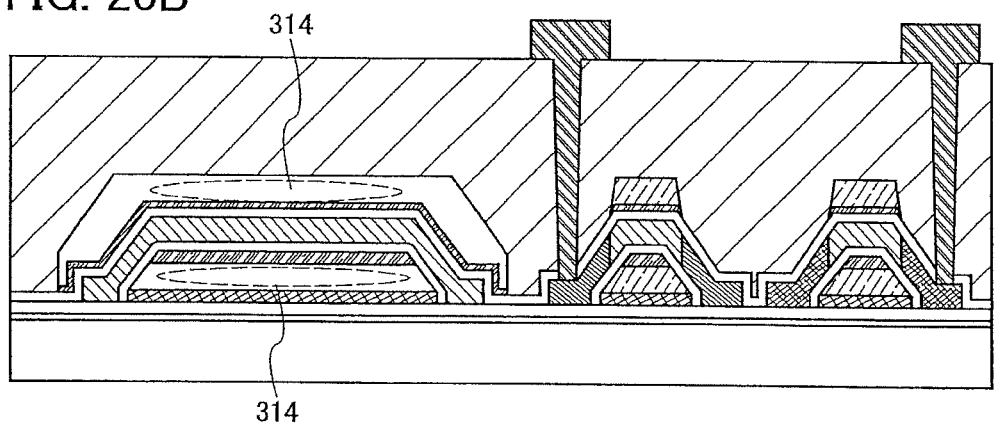
Figure 20C:
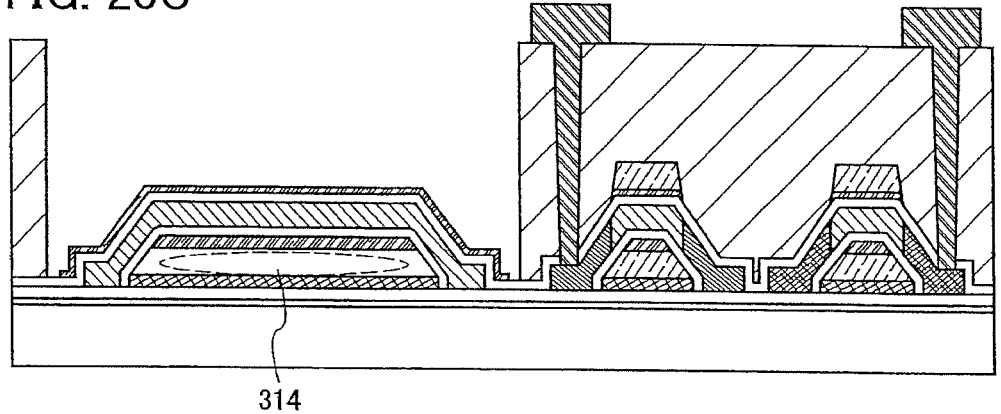

Lastly, a tenth example is shown in FIGS. 20A to 20C. In this example, the first conductive layer 303 is formed with three layers, an upper layer, an intermediate layer, and a lower layer, and the second conductive layer 307 is formed with two layers, an upper layer and a lower layer as shown in FIG. 20A, and the intermediate layer of the first conductive layer 303 and the upper layer of the second conductive layer 307 are used as sacrifice layers. Then, an opening is formed by removing the third insulating layer 310 except in the region where a structure body is to be formed, and sacrifice layer etching is performed. Accordingly, a structure body which includes the spatial portions 314 above and below the structure layer can be formed as shown in FIG. 20B. Alternatively, an opening may be formed by removing the third insulating layer 310 in the region where a structure body is to be formed, and sacrifice layer etching may be performed. Accordingly, a structure body which includes the spatial portion 314 below the structure layer can be formed as shown in FIG. 20C. In the structure body manufactured as described above, the lower layer of the first conductive layer 303 serves as a fixed electrode, and the upper layer of the first conductive layer 303, the first insulating layer 304, the semiconductor layer 305, the second insulating layer 306, and the lower layer of the second conductive layer 307 serve as a structure layer.

In a case of forming a thick sacrifice layer in the above structural examples 1 to 10, layers used as sacrifice layers can be formed and processed in two or more stages. In a case of forming sacrifice layers in a plurality of stages or forming a plurality of sacrifice layers, the sacrifice layers are preferably made of the same material or materials which can be etched by the same method. When a plurality of sacrifice layers is formed of the same material, sacrifice layer etching for forming a structure body can be carried out at a time. Accordingly, the number of steps can be reduced, and the cost for forming a micromachine can be reduced. Note that different materials can be used depending on conditions such as adhesiveness to layers formed above and below. In this case, sacrifice layer etching for forming a structure body may be carried out twice.

The thickness of the sacrifice layer is determined by considering various factors such as a material of the sacrifice layer, a structure and an operation method of the structure body, and a method of sacrifice layer etching. If the sacrifice layer is too thin, there is a problem in that an etchant is not diffused and the sacrifice layer is not etched. Further, when the sacrifice layer is thin, buckling of the structure layer occurs after etching. In a case of operating the structure body by electrostatic attraction, the distance between a fixed electrode and a movable electrode is increased if the sacrifice layer is too thick; therefore, it becomes impossible to operate the structure body. In a case of operating the structure body by electrostatic attraction, for example, the sacrifice layer preferably has a thickness of 0.5 μm to 4 μm, more preferably 1 μm to 2.5 μm.

Layers adjacent to the sacrifice layer, for example, the first insulating layer and the second insulating layer are preferably formed using a material which is hardly etched when sacrifice layer etching is carried out. Even if it is hard to obtain selectivity between the sacrifice layer and the semiconductor layer, sacrifice layer etching can be easily performed by protection of the semiconductor layer with the first insulating layer and the second insulating layer.

On the other hand, the first insulating layer and the second insulating layer forming the structure layer can be removed if they are unnecessary. For example, each insulating layer can be processed into an arbitrary shape by photolithography and etching at the time of formation. Alternatively, the insulating layers can be removed after sacrifice layer etching.

The structures of the structure bodies described in this embodiment mode are mere examples, and the method for forming a semiconductor element and a structure body at the same time is not limited to the above examples. For example, a structure layer can be formed using the third insulating layer and the third conductive layer.

Note that this embodiment mode can be freely combined with either of the above-described embodiment modes.

Embodiment Mode 4

This embodiment mode describes an example of a method for forming a structure layer of a semiconductor layer, like the structure layer 108 described in Embodiment Mode 1 with reference to FIGS. 1A to 4B and the structure layer 208 described in Embodiment Mode 2 with reference to FIGS. 5A to 9D.

Figure 21A:
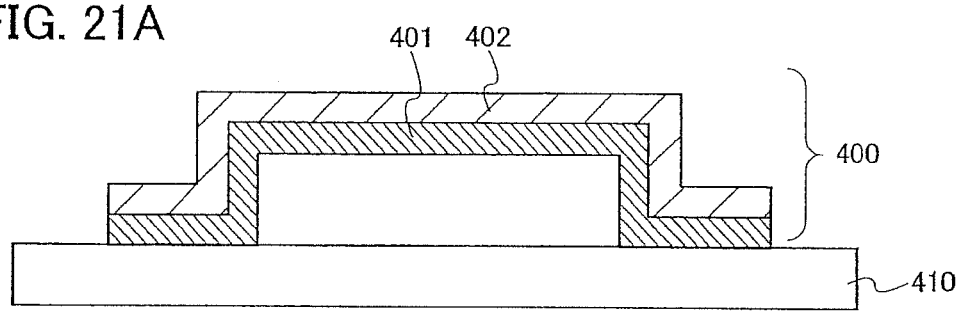
FIGS. 21A to 21E are diagrams illustrating a method for manufacturing a micromachine of the present invention.
Figure 21B:
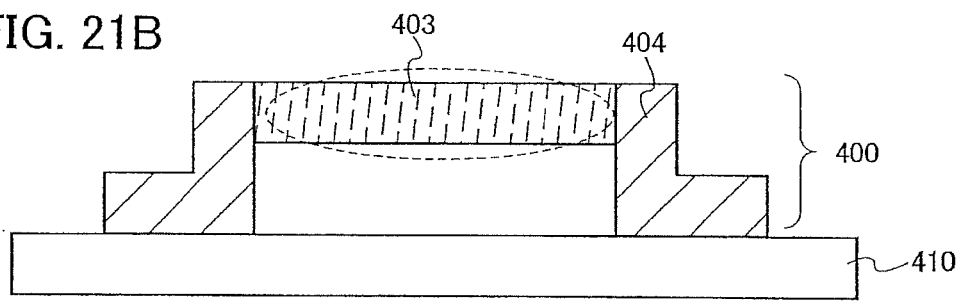

FIGS. 21A to 21E show structure bodies formed of semiconductor layers. For example, a structure layer of a structure body 400 can be formed by stacking a layer 401 including polycrystalline silicon which is crystallized using the above steps and a layer 402 including amorphous silicon as shown in FIG. 21A. In each of FIGS. 21A to 21E, a reference numeral 410 denotes a substrate having an insulating surface.

Silicon layers having different crystal states, like the layer including polycrystalline silicon and the layer including amorphous silicon in the above example, have different mechanical characteristics. Therefore, a structure body appropriate for various applications can be manufactured by formation of the structure layer by stacking layers as described in the above example or in a selective region.

<Measurement of Complex Elastic Modulus and Indentation Hardness>

In order to examine the difference in mechanical characteristics between silicon layers having different crystal states, measurement is conducted on complex elastic modulus and indentation hardness of a layer including amorphous silicon formed by a CVD method and a layer including polycrystalline silicon. Here, the layer including polycrystalline silicon is obtained by crystallizing a layer including amorphous silicon through laser crystallization using a metal catalyst.

The layer including amorphous silicon used as a sample is an amorphous silicon layer formed over a base layer that is a 50-nm-thick silicon nitride layer and a 100-nm-thick silicon oxide layer formed over a quartz substrate by a CVD method. The amorphous silicon layer is formed by a CVD method.

The layer including polycrystalline silicon used as a sample is a layer obtained by crystallizing a layer including amorphous silicon formed similarly to the above description with the use of a continuous wave laser. Here, a laser beam used for crystallization is a second harmonic of a Nd:YVO$_4$ layer with an energy density of 9 W/cm$^2$ to 9.5 W/cm$^2$ and a scan speed of 35 cm/sec.

Here, the sample layer including amorphous silicon is formed with a thickness of 66 nm, and the thickness of the layer including polycrystalline silicon crystallized by laser irradiation is approximately 60 nm.

Measurement is conducted by nanoindentation measurement in which an indenter with a triangular pyramid shape is pressed into a sample. A condition for the measurement is a single press of an indenter and the indenter used is a Berkovich indenter made of diamond. Therefore, the elastic modulus of the indenter is about 1000 GPa with a Poisson's ratio of about 0.1.

The complex elastic modulus that is measured is obtained by combining the elastic modulus of the sample and that of the indenter, which is expressed by the following formula (1). In the formula (1), Er is a complex elastic modulus, E is Young's modulus, and ν is Poisson's ratio. A first term in the formula (the term shown by "sample") is a term to which the elastic modulus of the sample contributes, and a second term (term shown by "indenter") is a term to which the elastic modulus of the indenter contributes.

As shown in the formula (1), the complex elastic modulus is obtained from the sum of the first term to which the elastic modulus of the sample contributes and the second term to which the elastic modulus of the indenter contributes. However, since the elastic modulus of the indenter is much higher than that of the sample, the second term can be ignored, so that the complex elastic modulus approximately shows the elastic modulus of the sample.

Moreover, the indentation hardness is hardness measured by an indentation method and obtained by dividing the maximum press fit weight of the indenter by a projection area at the maximum press fit. Here, the projection area at the press fit is obtained by a geometric shape of the indenter and a contact depth when the indenter presses the sample. By multiplying this indentation hardness by 76, it can be treated equally to Vickers hardness, which is generally used as an indicator of hardness.

Formula (1)

$$\frac{1}{Er} = \left(\frac{1-v^2}{E}\right)_{sample} + \left(\frac{1-v^2}{E}\right)_{indenter} \quad (1)$$

Table 1 shows a measurement result of complex elastic modulus and indentation hardness of the layer including polycrystalline silicon and the layer including amorphous silicon. The result shows an average value of three measurement results.

According to the result shown in Table 1, the layer including polycrystalline silicon has higher elastic modulus than the layer including amorphous silicon. In other words, Table 1 indicates that, in the case where structure bending force acts, the layer including polycrystalline silicon has stronger resistance against bending than the layer including amorphous silicon.

Moreover, the result shown in Table 1 indicates that the layer including polycrystalline silicon is harder than the layer including amorphous silicon.

TABLE 1

| Sample | complex elastic modulus (GPa) | indentation hardness (GPa) |
| --- | --- | --- |
| the layer including amorphous silicon | 141 | 15.5 |
| the layer including polycrystalline silicon | 153 | 20.3 |

By thus stacking semiconductor layers having different elastic modulus and hardnesses, it is possible to manufacture the structure body 400 having both of hardness and high flexibility against bending. For example, even though breaking occurs due to crystal defects of the layer including polycrystalline silicon, the breaking is unlikely to spread to the layer including amorphous silicon when the layer are stacked; therefore, the breaking can be stopped before the layer including amorphous silicon. Thus, the balance between flexibility and hardness can be determined by a ratio between thicknesses of stacked layers.

Stack Example 1 of Structure Layer

In a case of crystallizing silicon with the use of metal as a catalyst as described in Embodiment Mode 1, metal can be selectively added to the layer including amorphous silicon, For example, a structure layer can be formed with a layer including polycrystalline silicon obtained by partial crystallization of the layer including amorphous silicon. Further, in a case of crystallizing silicon with the use of a laser, a structure layer can be formed to have partially the layer including polycrystalline silicon obtained by selective irradiation of the layer including amorphous silicon with a laser beam.

When such a method is employed, a structure layer over the spatial portion of the structure body 400 can be partially crystallized, thereby forming a structure layer with a layer 404 including amorphous silicon and a layer 403 including polycrystalline silicon. Such a structure layer can be formed as follows. A sacrifice layer is formed over a substrate, and the layer 404 including amorphous silicon is formed thereover. Then, a metal catalyst is added to only a part of the layer 404 including amorphous silicon over the sacrifice layer, or the part of the layer 404 is irradiated with a laser beam.

Figure 21C:
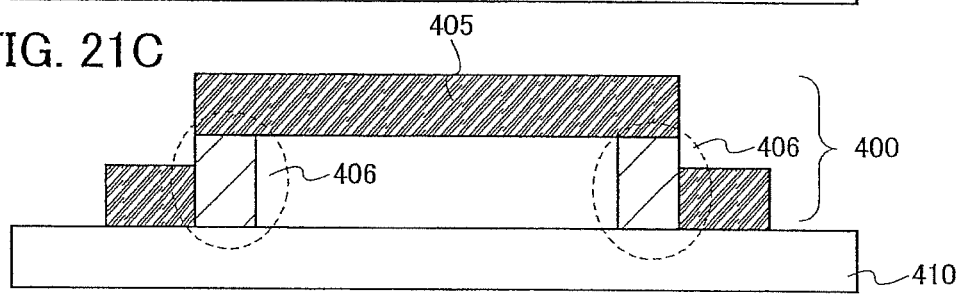

By changing the concentration of metal to be added, heating conditions, conditions of a laser used for irradiation, or the like, a structure layer can be formed in which only a brace portion 406 of a beam structure is formed of a layer including amorphous silicon, and a beam portion 405 and a portion of the structure layer in contact with the substrate are crystallized so as to be formed of a layer including polycrystalline silicon, as shown in FIG. 21C. When the structure layer is formed as described above, the beam portion 405 which is movable can have high tenacity and the brace portion 406 can have flexibility.

Further, it is generally known that a silicon alloy in which metal is combined with silicon has high strength. Therefore, the metal which is used as a catalyst when crystallizing the layer including amorphous silicon does not necessarily need to be removed from the semiconductor layer. The metal can be added to the semiconductor layer entirely or partially. The metal added can remain in the whole semiconductor layer or can be selectively removed so as to remain partially. If necessary, a conductive silicon alloy layer which is still harder can be formed through appropriate heat treatment.

A conductive structure layer having flexibility and hardness can be formed by arbitrarily stacking any of such a layer including a silicon alloy, the above-described layer including polycrystalline silicon (polysilicon layer), and an amorphous silicon layer.

The layer including polycrystalline silicon which is crystallized by addition of a metal catalyst and laser irradiation includes polycrystalline silicon in which crystals are grown perpendicularly to the substrate. On the other hand, it includes polycrystalline silicon in which crystals are grown parallel to the substrate when irradiated with a laser beam without using metal. It is thought that such layers including polycrystalline silicon with different crystallization directions are different in hardness and elastic modulus. Thus, a semiconductor layer excellent as a structure layer can be formed by stacking both of them.

For example, a structure layer in which layers having different crystal directions are stacked can be formed by stacking a layer including polycrystalline silicon crystallized with the use of metal and a layer including polycrystalline silicon crystallized without the use of metal. Therefore, even when a minute crack is caused in a layer included in the structure layer, the crack is stopped at another layer with a different crystal direction, the structure layer can be prevented from being destroyed wholly, and a structure layer with high strength can be formed.

Figure 21D:
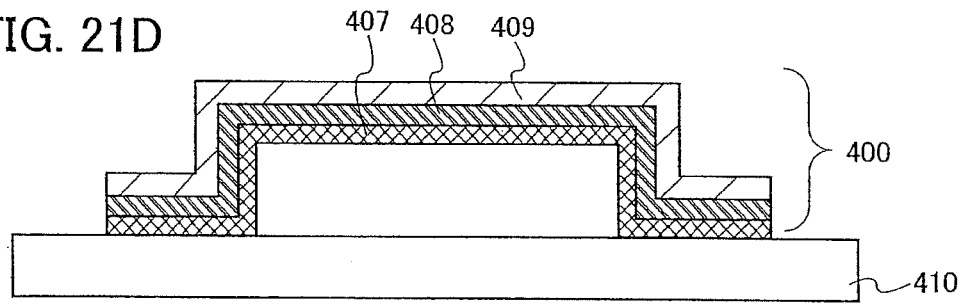

The structure body 400 including a structure layer formed by stacking a plurality of layers can be formed as shown in FIG. 21D by arbitrarily stacking the layers including polycrystalline silicon with different crystallization directions, the above-described layer including amorphous silicon, and the layer including a silicon alloy. Here, FIG. 21D shows the structure body 400 including a structure layer which is formed by stacking three layers 407, 408, and 409 selected from the layers including polycrystalline silicon with different crystallization directions, the layer including amorphous silicon, and the layer including a silicon alloy.

Thus, the structure body 400 having necessary properties (such as hardness, flexibility, and conductivity) can be manufactured when its structure layer is formed by stacking layers having various properties.

Figure 21E:
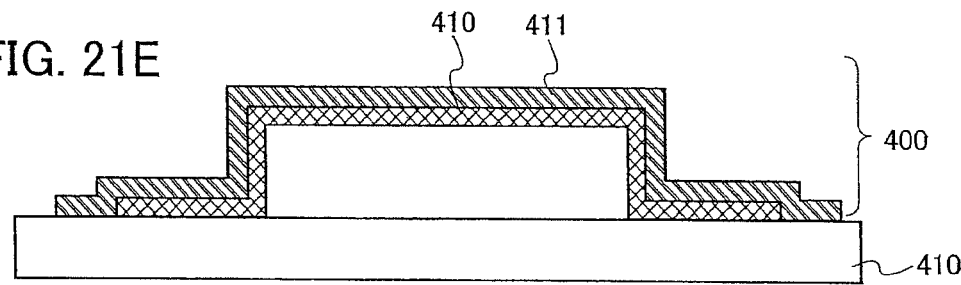

In addition, the structure layer can be formed by stacking a plurality of layers which is formed through repetitive formation and processing, as shown in FIG. 21E. For example, in a case of forming the structure layer using only the layer including amorphous silicon, the structure layer can be formed by formation and processing of a first layer 410 including amorphous silicon and then similar formation and processing of a second layer 411 including amorphous silicon. Here, the layers to be stacked can be processed by etching after formation of a resist mask by a photolithography method.

When the structure layer is formed by stacking layers through repetitive formation and processing, the structure layer can have less internal stress. For example, even in a case of using a layer which has high internal stress and which is difficult to be formed to be thick at a time like amorphous silicon, the layer with a necessary thickness as the structure layer can be obtained by employing this method. In a case of using a layer including amorphous silicon, the structure layer can be formed by repeatedly performing a plurality of times of film formation and dehydrogenation through heating.

Even in a case of forming the structure layer by stacking different layers, for example, in a case of forming the structure layer by stacking a layer including amorphous silicon and a layer including polycrystalline silicon, the structure layer can be formed by repetitive formation and processing of each layer. In a case of forming the structure layer by stacking different layers as described above, the structure layer can also be formed by successively forming layers and then processing them, as shown in FIG. 21A. However, when the structure layer is formed through repetitive film formation and processing, the stacked layers can be prevented from being separated at an interface due to internal stress of the stacked layers. Such a method is particularly effective when the structure layer is formed using a layer having high internal stress.

A combination of layers to be stacked for forming the structure layer can be freely selected from the following layers: the above-described layers including polycrystalline silicon with different crystallization directions, the layer including amorphous silicon, and the layer including a silicon alloy. Accordingly, a structure layer having arbitrary characteristics such as flexibility, hardness, and conductivity can be formed.

As in the above-described example, it is possible to form a structure body including a structure layer with desired properties by stacking or partly forming silicon layers or layers of silicon compounds having various properties in various ways.

Stack Example 2 of Structure Layer

Figure 22A:
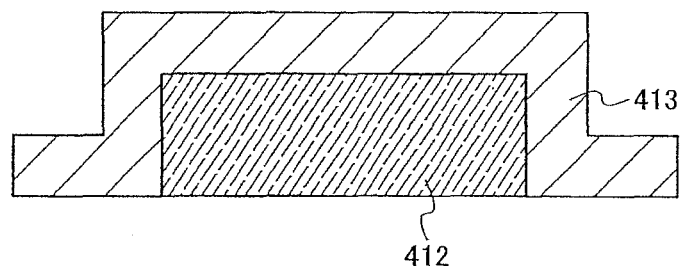
FIGS. 22A to 22D are diagrams illustrating a method for manufacturing a micromachine of the present invention.
Figure 22B:
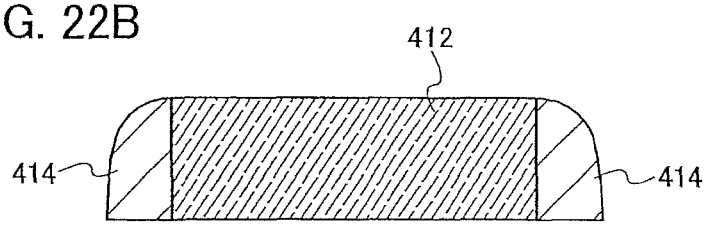

In order to enhance strength of the structure layer, a structure body in which a brace portion of a beam structure is reinforced can be formed as shown in FIGS. 22A to 22D. In specific, a sacrifice layer 412 is formed, and a first layer 413 is formed thereover using a material which reinforces a brace portion as shown in FIG. 22A. After that, anisotropic dry etching is applied, so that the first layer 413 can remain only on sides of the sacrifice layer 412 as shown in FIG. 22B. In this embodiment mode, this remaining portion is referred to as a reinforcing portion 414.

Figure 22C:
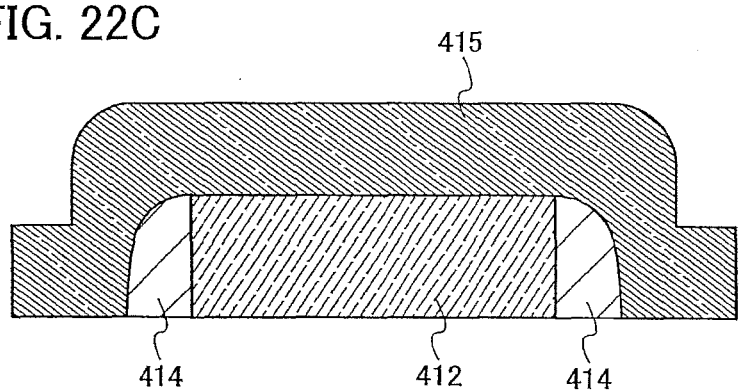
Figure 22D:
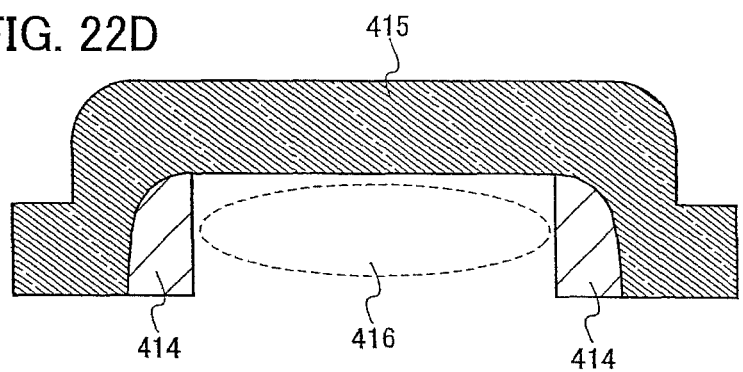

Next, a structure layer 415 is formed over the sacrifice layer 412 and the reinforcing portion 414 as shown in FIG. 22C. The structure layer 415 can be formed using various materials and methods as described in Embodiment Modes 1 to 3 and this embodiment mode. After that, sacrifice layer etching is performed. Accordingly, a structure body which includes a spatial portion 416 and the reinforcing portion 415 below the structure layer 415 can be formed as shown in FIG. 22D.

When the structure layer is formed over a thick layer such as a sacrifice layer, the thickness of the structure layer in a step portion, that is, a brace portion of a beam structure is thin, so that the strength of the structure body is lowered. The strength of the structure layer can be increased by formation of the reinforcing portion 414 in the structure body as in the examples described with reference to FIGS. 22A to 22D.

Note that this embodiment mode can be freely combined with any of Embodiment Modes 1 to 3.

Embodiment Mode 5

This embodiment mode describes an example of a structure and a function of the micromachine of the present invention. The micromachine of the present invention is characterized by including a structure body with a three-dimensional structure, and an electric circuit having a semiconductor element and controlling the structure body.

Figure 23:
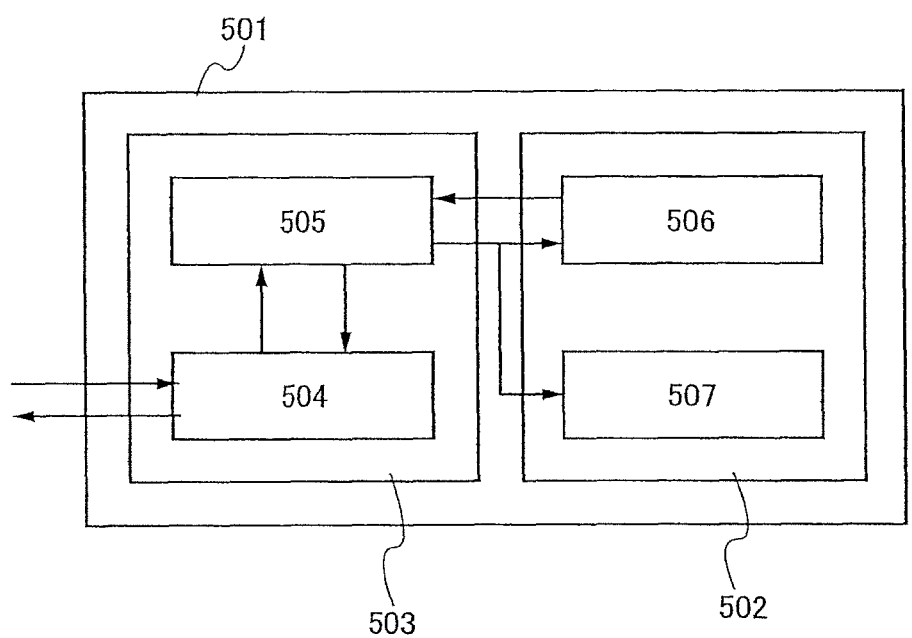
FIG. 23 is a diagram illustrating a micromachine of the present invention.

FIG. 23 shows a conceptual diagram of a micromachine. A micromachine 501 includes a structure body 502 and an electric circuit 503 which includes semiconductor elements.

The structure body 502 included in the micromachine 501 has a space which is formed by removing a sacrifice layer formed between a substrate and a structure layer, and the structure layer is movable in the space in many cases. The structure body 502 can function as a sensor for detecting a physical quantity or an actuator for converting a signal from the electric circuit 503 into displacement. In addition, as shown in FIG. 23, the micromachine 501 can include a plurality of structure bodies (a first structure body 506, a second structure body 507, and the like in the diagram).

The electric circuit 503 included in the micromachine 501 includes an interface circuit 504 for performing communication with an external control device, and a control circuit 505 which processes a signal for controlling the structure body. In addition, the electric circuit 503 can include an amplifier circuit which amplifies an output signal from the structure body, an A/D converter which converts a control signal from the external control device from an analog signal to a digital signal, a D/A converter which converts from a digital signal to an analog signal, a memory which stores a control program of the structure body, a memory control circuit which controls the memory, and the like.

Figure 24A:
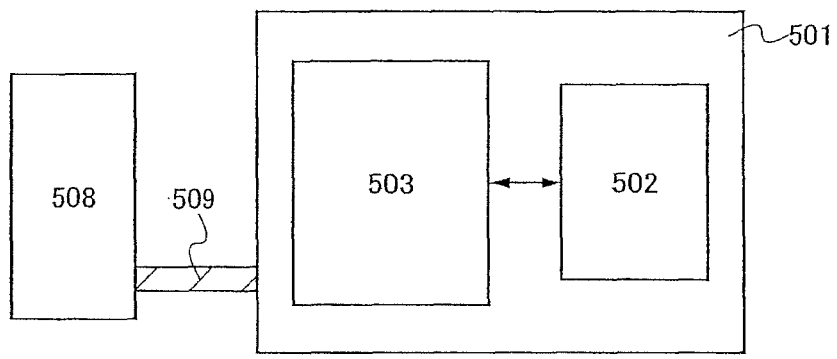
FIGS. 24A to 24C are diagrams each illustrating a micromachine of the present invention.

Next, the function of the micromachine having the above structure is described with reference to FIGS. 24A to 24C. For example, the micromachine 501 of the present invention includes the structure body 502 and the electric circuit 503 as shown in FIG. 24A. In addition, the micromachine 501 is connected to an external control device 508 for controlling the micromachine 501 with a cable (transmission line) 509, and a control signal and a driving power are supplied from the external control device 508 to the micromachine 501. Here, a transmission line for transmitting and receiving a control signal and a transmission line for supplying power may be the same or different.

For example, in a case where the structure body 502 functions to detect a physical quantity, substance concentration, or the like, the micromachine 501 can function as a sensor in which information detected by the structure body 502 is processed by the electric circuit 503 and is transmitted to the external control device 508. In this case, the electric circuit 503 can include the control circuit, the A/D converter, the D/A converter, the memory, the memory control circuit, and the like as described above.

Figure 24B:
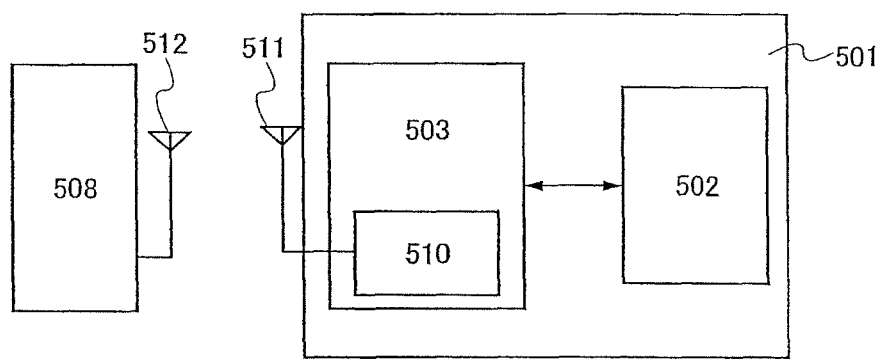

As shown in FIG. 24B, the micromachine 501 of the present invention can include the electric circuit 503 which includes a wireless communication circuit 510 communicating with the external control device without wire, and other circuits, and the structure body 502. Here, the wireless communication circuit 510 can include an antenna 511 for transmitting and receiving an electromagnetic wave, a power supply circuit which generates driving power of the electric circuit 503 and the structure body 502 from the electromagnetic wave received by the antenna 511, a demodulation circuit which demodulates a signal from the electromagnetic wave received by the antenna 511, and the like. The wireless communication circuit 510 can further include, as a power source, a battery, a power generating circuit which generates power from light, heat, or the like, and the like besides the power supply circuit which generates driving power from an electromagnetic wave.

Thus, when the micromachine includes the wireless communication circuit 510 and communicates with the external control device 508 using an electromagnetic wave without a wire, the micromachine 501 is not limited by a transmission cable, and the degree of freedom of operable range can be enlarged. With the capability of wireless communication as described above, it becomes possible to realize a micromachine which can be located anywhere and is familiar to a user. In this case, the external control device 508 which controls the micromachine 501 also includes a wireless communication circuit, an antenna 512, and the like for communication with the micromachine 501.

Figure 24C:
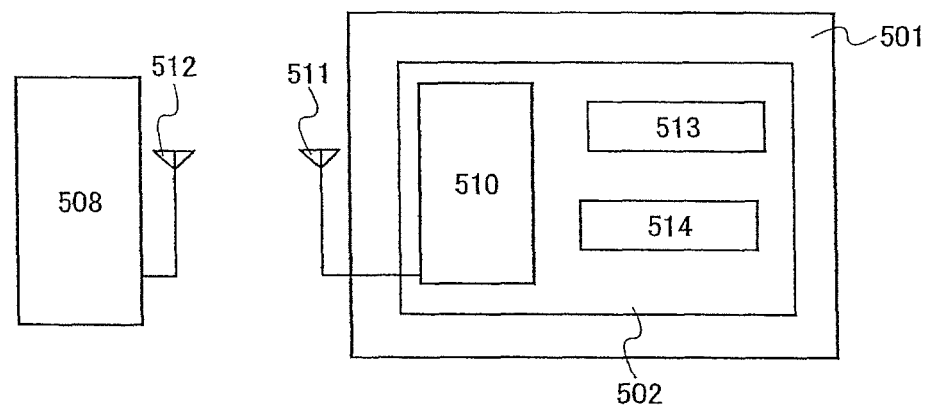

As shown in FIG. 24C, the micromachine 501 can constitute a part of a semiconductor device (such as an RFID tag or an IC tag) which performs wireless communication. In other words, it is possible to manufacture a semiconductor device (=micromachine) in which a passive element such as a capacitor or an inductor, a switch, a waveguide for transmitting a high-frequency signal, or the like included in the wireless communication circuit 510 is formed using a structure body. In this case, the micromachine 501 includes the wireless communication circuit 510, a demodulation circuit 513, a signal processing circuit 514, and the like, and the wireless communication circuit 510, the demodulation circuit 513, and the like each include a passive element, a switch, or the like which is formed using a structure body.

When the passive element is formed using a structure body, better characteristics than ever before can be obtained. Accordingly, highly-sensitive wireless communication can be performed when a wireless communication circuit is formed using the passive element. Further, a semiconductor device capable of communication in a high-frequency band and a broad-frequency band can be provided.

The micromachine of the present invention can also include a memory in which a storage element is formed using a structure body. Further, the micromachine of the present invention can include the above-described wireless communication circuit and memory.

Figure 25A:
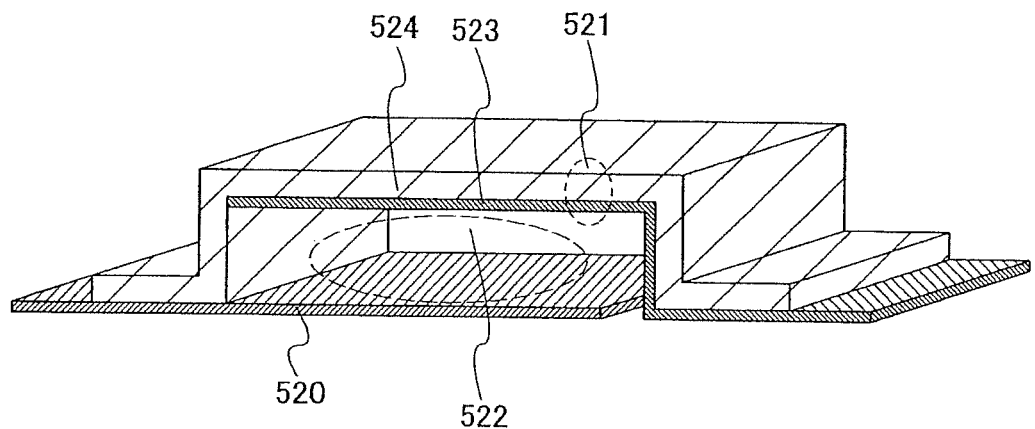
FIGS. 25A and 25B are diagrams each illustrating a structure body included in a micromachine of the present invention.
Figure 25B:
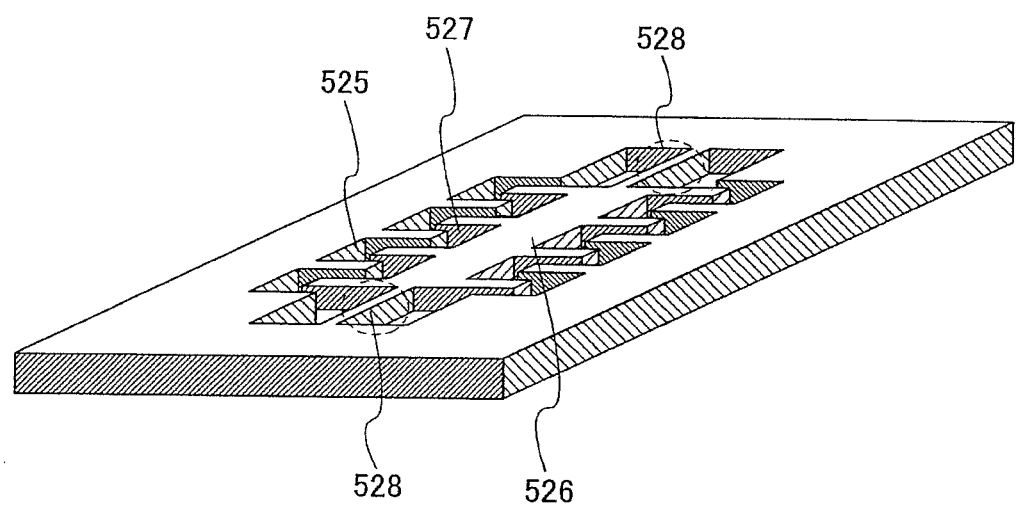

Next, FIGS. 25A and 25B show examples of the structure body included in the micromachine of the present invention. A structure body shown in FIG. 25A includes a first conductive layer 520 and a structure layer 521 over a substrate, and a spatial portion 522 between the first conductive layer 520 and the structure layer 521. This spatial portion 522 is formed by forming a sacrifice layer and the structure layer 521 over the first conductive layer 520 and then removing only the sacrifice layer by etching.

Further, the sacrifice layer has a very important role in forming the structure body, which serves to form the spatial portion 522 between the structure layer 521 and the substrate by being removed by sacrifice layer etching. However, the structure body of the micromachine in the form of an end product often does not include the sacrifice layer because the sacrifice layer is removed by sacrifice layer etching. For sacrifice layer etching, the sacrifice layer is preferably formed using a substance which can have high selectivity to the first conductive layer 520 and the structure layer 521 and can be easily removed by etching.

The spatial portion 522 formed by etching the sacrifice layer is formed between the substrate and the structure layer 521, that is, in a portion where the sacrifice layer has been located.

The structure layer 521 is often formed with a stacked structure of an insulating layer 524 and the second conductive layer 523 which faces the first conductive layer 520 with the spatial portion 522 interposed therebetween. However, the structure layer is not limited to the above example, and can also be formed with a single layer of a conductive layer or an insulating layer.

The structure body formed as described above includes the first conductive layer 520 formed over the substrate, and the second conductive layer 523 which faces the first conductive layer 520 with the spatial portion 522 interposed therebetween. One of these two conductive layers is a "fixed electrode" which is fixed to the substrate and is not movable, and the other is a "movable electrode" which is movable in the spatial portion. Here, the terms "fixed electrode" and "movable electrode" are used to express whether the electrode is mechanically movable or fixed to the substrate or the like, and does not mean that a potential applied to the electrode is fixed or movable.

As described above, the structure body can function as an actuator in which the movable electrode (or the structure layer) is moved by voltage application between the fixed electrode and the movable electrode and attraction of the movable electrode to the fixed electrode side by electrostatic attraction. Since the capacitance between two electrodes changes when the structure layer 521 is moved in the spatial portion 522 due to external force (such as pressure and acceleration), the structure body can function as a sensor which detects the capacitance change.

Alternatively, the structure body can have a pectinate shape and can move along a direction parallel to the substrate as shown in FIG. 25B. In this case, the structure body includes a fixed electrode 525 (first conductive layer) provided on a side of a pectinate shape fixed to the substrate (that is, a side perpendicular to the substrate), and a structure layer 526 which is formed so as to engage with the fixed electrode having a pectinate shape with a space interposed therebetween. The structure layer includes a movable electrode 527 (second conductive layer) on a side opposite to the fixed electrode (that is, also a side perpendicular to the substrate).

The structure body as described above is fixed to the substrate by connection of a part thereof to a layer formed over the substrate, and is movable along a predetermined direction (for example, a direction of the pectinate shape). For example, in a case of the structure body shown in FIG. 25B, the structure body is separated from the substrate with a space between the fixed electrode 525 and the movable electrode 527 and between the substrate and the structure layer 526. Further, the structure body has a structure in which the structure layer 526 is fixed to a part of the substrate at two points (528 in the drawing) of a portion without the pectinate shape and is movable along a direction of the pectinate shape (from right/left to left/right in the drawing).

As described above with reference to FIGS. 25A and 25B, structure bodies with various shapes can be formed. The structure body shown in FIG. 25A includes the fixed electrode (first conductive layer 520) and the movable electrode (second conductive layer 523) on a plane parallel to the substrate, and a space between these two electrodes. On the other hand, the structure body shown in FIG. 25B includes the fixed electrode 525 and the movable electrode 527 which are perpendicular to the substrate, and a space between these two electrodes and between the substrate and the structure layer. Structure bodies having different shapes, in which movable directions of structure layers are different, can be used for different purposes (for example, sensors for different directions and different physical quantities).

Besides the above-described examples, a structure body including a space formed by removal of a sacrifice layer and a structure layer which is however not movable can be formed. For example, a passive element such as an inductor or a capacitor, a waveguide, a switch, or the like, a part of which is supported by a substrate and another part of which is separated from the substrate, can be formed. When a passive element or a waveguide is formed to be separated from a substrate, influence from the substrate can be reduced. When a high-frequency circuit is formed using this, the circuit can be formed to have little loss and good frequency characteristics.

The above-described structure bodies are mere examples, and a structure body can be formed to have a shape suited to a purpose through steps according to the purpose and a predetermined function by various driving methods. For example, the structure body shown in FIG. 25A can be used as a sensor which detects displacement of the structure layer due to external force, and can alternatively be used as a variable capacitor which changes a capacitance between two electrodes. Thus, one structure body can have different functions by using different driving methods.

As described above, the structure body included in the micromachine of the present invention can constitute not only a part of a sensor or an actuator but also a part of an electric circuit, such as a passive element or a waveguide. A passive element (such as a capacitor, an inductor, or a resistor) is an important component, for example, in a case of performing wireless communication using a high-frequency range, but it was difficult to form a passive element which operates at high speed with little loss through steps of forming a general semiconductor element (such as a CMOS or a BiCMOS). However, when a passive element is formed using the structure body formed through the above-described steps, the passive element can have favorable characteristics.

Conventionally, in the case of treating a minute object having a size of submillimeter, such a process has been necessary that a structure of the minute object is magnified first, a person or a computer obtains information thereof and carries out information processing and operation setting, and the operation is reduced in size and sending to the minute object. In contrast, the micromachine described in this embodiment mode can treat a minute object by only transmission of a dominant concept instruction from a person or a computer. In other words, once a person or a computer determines a purpose and sends an instruction, the micromachine can operate by obtaining and processing information on an object using a sensor or the like.

Note that this embodiment mode can be freely combined with any of Embodiment Modes 1 to 4.

This application is based on Japanese Patent Application serial no. 2006-076728 filed in Japan Patent Office on Mar. 20, 2006, the entire contents of which are hereby incorporated by reference.

What is claimed is:

1. A method for manufacturing a micromachine, comprising the steps of:
    forming a first conductive layer over a substrate;
    forming a first sacrifice layer over the first conductive layer;
    forming a gate electrode over the substrate, and a second sacrifice layer over the first sacrifice layer;
    forming a first insulating layer over the gate electrode;
    forming a semiconductor layer including silicon over the gate electrode with the first insulating layer interposed therebetween, and a structure layer including silicon over the second sacrifice layer; and
    removing a part of the first sacrifice layer, and the second sacrifice layer.

2. A method for manufacturing a micromachine, comprising the steps of:
    forming a first conductive layer over a substrate;
    forming a first sacrifice layer over the first conductive layer;
    forming a gate electrode over the substrate, and a second sacrifice layer over the first sacrifice layer;
    forming a first insulating layer over the gate electrode;
    forming a semiconductor layer including silicon over the gate electrode with the first insulating layer interposed therebetween, and a structure layer including silicon over the second sacrifice layer;
    forming a second insulating layer over the semiconductor layer and the structure layer;
    forming a second conductive layer over the second insulating layer;
    exposing a part of the first sacrifice layer and a part of the second sacrifice layer by removing a part of the second insulating layer; and
    removing the part of the first sacrifice layer, and the part of the second sacrifice layer.

3. The method for manufacturing a micromachine according to claim 1, wherein the semiconductor layer and the structure layer are crystallized by thermal crystallization using metal or laser crystallization using metal.

4. The method for manufacturing a micromachine according to claim 2, wherein the semiconductor layer and the structure layer are crystallized by thermal crystallization using metal or laser crystallization using metal.

5. The method for manufacturing a micromachine according to claim 1, further comprising a step of attaching an opposite substrate provided with a third conductive layer so as to face the substrate.

6. The method for manufacturing a micromachine according to claim 2, further comprising a step of attaching an opposite substrate provided with a third conductive layer so as to face the substrate.

7. A method for manufacturing a micromachine, comprising the steps of:
    forming a first conductive layer over a substrate;

forming a first sacrifice layer over the first conductive layer;

forming a gate electrode over the substrate, and a second sacrifice layer over the first sacrifice layer;

forming a first insulating layer over the gate electrode;

forming a semiconductor layer including silicon over the gate electrode with the first insulating layer interposed therebetween, and a structure layer including silicon over the second sacrifice layer;

forming a second conductive layer over the semiconductor layer and the structure layer by forming a conductive film and processing the conductive film into a predetermined shape; and removing the first sacrifice layer, and the second sacrifice layer.

8. The method for manufacturing a micromachine according to claim 7, wherein the semiconductor layer is a stacked layer of an amorphous silicon or a silicon including microcrystal, and a silicon to which an impurity is added.

* * * * *